(12) United States Patent
Tada

(10) Patent No.: US 11,217,651 B2
(45) Date of Patent: Jan. 4, 2022

(54) DISPLAY DEVICE

(71) Applicant: Japan Display Inc., Tokyo (JP)

(72) Inventor: Yusuke Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/733,339

(22) Filed: Jan. 3, 2020

(65) Prior Publication Data
US 2020/0227506 A1 Jul. 16, 2020

(30) Foreign Application Priority Data
Jan. 11, 2019 (JP) .............................. JP2019-003587

(51) Int. Cl.
*H01L 27/32* (2006.01)
*G06F 3/044* (2006.01)

(52) U.S. Cl.
CPC ........ *H01L 27/3276* (2013.01); *H01L 27/323* (2013.01); *H01L 27/3272* (2013.01); *G06F 3/0446* (2019.05)

(58) Field of Classification Search
None
See application file for complete search history.

(56) References Cited

U.S. PATENT DOCUMENTS

2015/0177879 A1 6/2015 Misaki
2018/0032188 A1 2/2018 Park et al.
2019/0115411 A1* 4/2019 Park ..................... H01L 51/524

FOREIGN PATENT DOCUMENTS

JP 2018185625 A 11/2018

OTHER PUBLICATIONS

Korean Office Action dated Mar. 10, 2021 for Korean Application No. 10-2019-0163586, with English machine translation.

* cited by examiner

*Primary Examiner* — Steven B Gauthier
(74) *Attorney, Agent, or Firm* — Michael Best & Friedrich LLP

(57) ABSTRACT

A display device includes a display region including a plurality of pixels, a plurality of first electrodes formed by wiring included in a first layer, and aligned in a first direction above the display region, a plurality of second electrodes formed by wiring included in the first layer, and aligned in a second direction intersecting the first direction, a connection wiring formed by wiring included in a second layer, and electrically connecting each of the plurality of first electrodes respectively, an insulating layer separating wiring included in the first layer and wiring included in the second layer, and a light shielding layer located at a different position to the connection wiring and overlapping a space between the plurality of first electrodes and the plurality of second electrodes in the first layer, in a plan view.

7 Claims, 43 Drawing Sheets

DISPLAY DEVICE

CROSS REFERENCE TO RELATED APPLICATIONS

This application is based upon and claims the benefit of priority from the prior Japanese Patent Application No. 2019-003587, filed on Jan. 11, 2019, the entire contents of which are incorporated herein by reference.

FIELD

One embodiment of the present invention is related to a display device including a touch sensor.

BACKGROUND

In recent years, liquid crystal display devices or organic EL display devices are widely being used as display screens in mobile information terminals and the like. In particular, an organic EL display device has the advantage in which a flexible structure can be provided which is thinner than a liquid crystal display device. In the case when these display devices are used as a display screen, a touch sensor is generally arranged as a user interface.

For example, an on-cell touch sensor is known as a touch sensor mounted on an organic EL display device. An on-cell touch sensor is formed using thin film formation technology above a light emitting element. A metal layer is used an electrode in an on-cell touch sensor. Therefore, a plurality of wirings which form the touch sensor are arranged between a plurality of light emitting elements so that the visibility of the display region is not lost (US Patent Application Publication No. 2018/0032188).

SUMMARY

A display device according to one embodiment of the present invention includes a display region including a plurality of pixels, a plurality of first electrodes formed by wiring included in a first layer, and aligned in a first direction above the display region, a plurality of second electrodes formed by wiring included in the first layer, and aligned in a second direction intersecting the first direction, a connection wiring formed by wiring included in a second layer, and electrically connecting each of the plurality of first electrodes respectively, an insulating layer separating wiring included in the first layer and wiring included in the second layer, and a light shielding layer located at a different position to the connection wiring and overlapping a space between the plurality of first electrodes and the plurality of second electrodes in the first layer, in a plan view.

DESCRIPTION OF EMBODIMENTS

Figure 1:
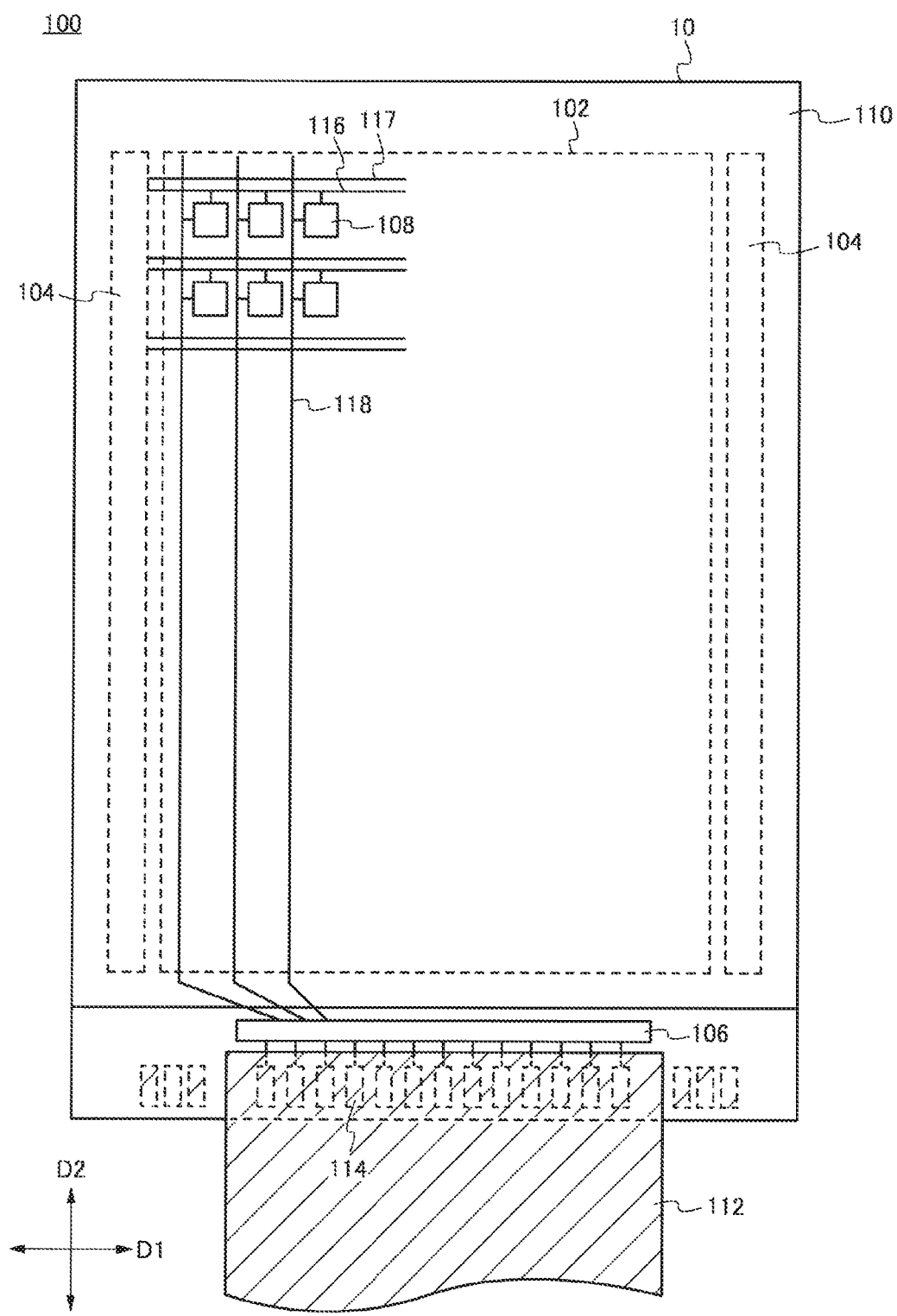
FIG. 1 is a plan view showing a structure of a display device in embodiment 1.

In the on-cell touch sensor described above, a plurality of electrodes are arranged in the same layer so that a gap is arranged between the electrodes. Therefore, the on-cell touch sensor includes a region where a metal layer is arranged and a region where a metal layer is not arranged (the gap described above). Therefore, in the case when the touch sensor is viewed from an oblique direction, although light is shielded in a region where the metal layer is arranged, light is visually recognized in a region where the metal layer is not arranged. As a result, there is a problem whereby an unintended pattern is seen because light is visually recognized only in the gap between the electrodes, and the visibility of the touch sensor is decreased.

One aim of one embodiment of the present invention is to provide a display device including a touch sensor with good visibility.

The embodiments of the present invention are explained herein while referring to the drawings. However, the present invention can be implemented in various modes without departing from the gist thereof, and is not construed as being limited to the description of the embodiments exemplified below. Although the drawings may be schematically represented with respect to the width, thickness, shape, and the like of each part as compared to the actual embodiment in order to clarify the explanation, they are merely examples and do not limit the interpretation of the present invention. In the present specification and each drawing, elements having the same functions as those described with reference to the previous drawings may be denoted by the same reference numerals, and overlapping explanations may be omitted.

In the present specification and claims, the terms "upper" and "lower" refer to the relative positional relationship with respect to the surface of a substrate on which a display element is formed (hereinafter simply referred to as "surface"). For example, in the present specification, the direction from the surface of the substrate toward the display element is referred to as "up", and the opposite direction is defined as "down". In addition, in the present specification and claims, when expressing an embodiment in which another structure is arranged above a certain structure, it is simply expressed as "upper" and unless otherwise specified, this includes both a case where another structure is arranged immediately above the certain structure so as to be in contact with the structure and a case where another structure is arranged above another structure interposed by another structure.

In the case when a plurality of thin film patterns are formed by processing a thin film formed on a substrate, the plurality of thin film patterns may have different functions or roles. However, these plural thin film patterns are formed by thin films formed in the same process, and are formed by the same material or the same layer structure. Therefore, the plurality of thin film patterns are defined as existing in the same layer. For example, in the case when "wiring included in a first layer" is described, it can be said that the wiring exists in the same layer and is formed by processing a thin film in the same process.

First Embodiment

A display device 100 according to the first embodiment of the present invention is explained while referring to FIG. 1 to FIG. 4. In the present embodiment, an organic EL display device is exemplified as the display device 100.

FIG. 1 is a plan view diagram showing a structure of a display device 100 of the first embodiment. However, for the purposes of explanation, a touch sensor 200 described herein is omitted from FIG. 1. The touch sensor 200 is explained using FIG. 2. FIG. 1 shows an approximate diagram in the case where a display region 102 included in a plurality of pixels is seen in a plan view. In the present specification, an appearance seen in a perpendicular direction from the front surface of the screen (display region 102) of the display device 100 is called a "plan view".

As is shown in FIG. 1, the display device 100 includes a display region 102 formed above an insulating surface, a scanning line drive circuit 104, and a driver IC 106. Here, the insulating surface is a surface of a substrate 10. A glass substrate, a metal substrate, a ceramic substrate, a semiconductor substrate or a flexible resin substrate can be used as the substrate 10. In particular, in the case when a flexible resin substrate having flexibility is used, it is possible to bend the display device 100. In the present embodiment, a substrate including a resin layer is used as the substrate 10.

A plurality of pixels 108 including a light emitting element are arranged in the display region 102. The periphery of the display region 102 is surrounded by a periphery region 110. The driver IC 106 functions as a control unit for providing a signal to the scanning line drive circuit 104. In addition, the driver IC 106 is incorporated with a signal line driver circuit (not shown in the diagram). Furthermore, although an example is shown in FIG. 1 in which the driver IC 106 is arranged above the substrate 10, the driver IC 106 may also be arranged above a flexible printed circuit substrate 112. The flexible printed circuit substrate 112 is electrically connected to a plurality of terminals 114 arranged in the periphery region 110.

The display region 102 includes a plurality of scanning lines 116 along a first direction (D1 direction), a plurality of power supply lines 117 along the first direction, and a plurality of signal lines along a second direction (D2 direction) which intersects the first direction. Each of the plurality of pixels 108 is connected to a scanning line 116, a power supply line 117, and a signal line 118. Therefore, the display region 102 includes a plurality of pixels 108 arranged in a matrix.

Figure 2:
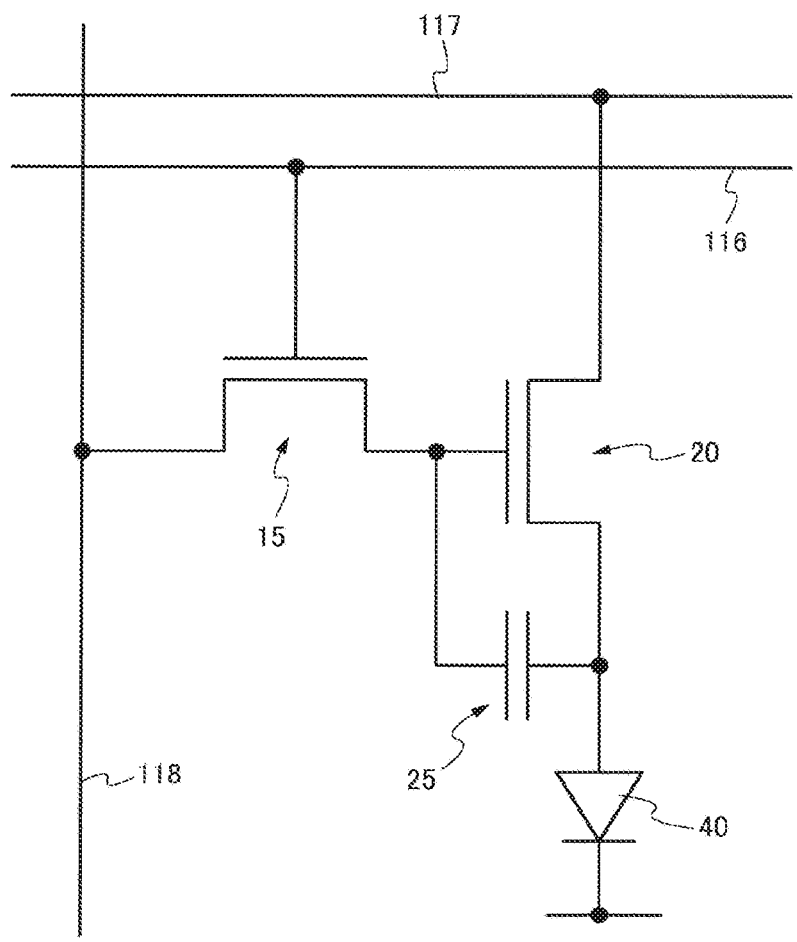
FIG. 2 shows a structure of pixel circuit included in each pixel in the display device in embodiment 1.
Figure 4:
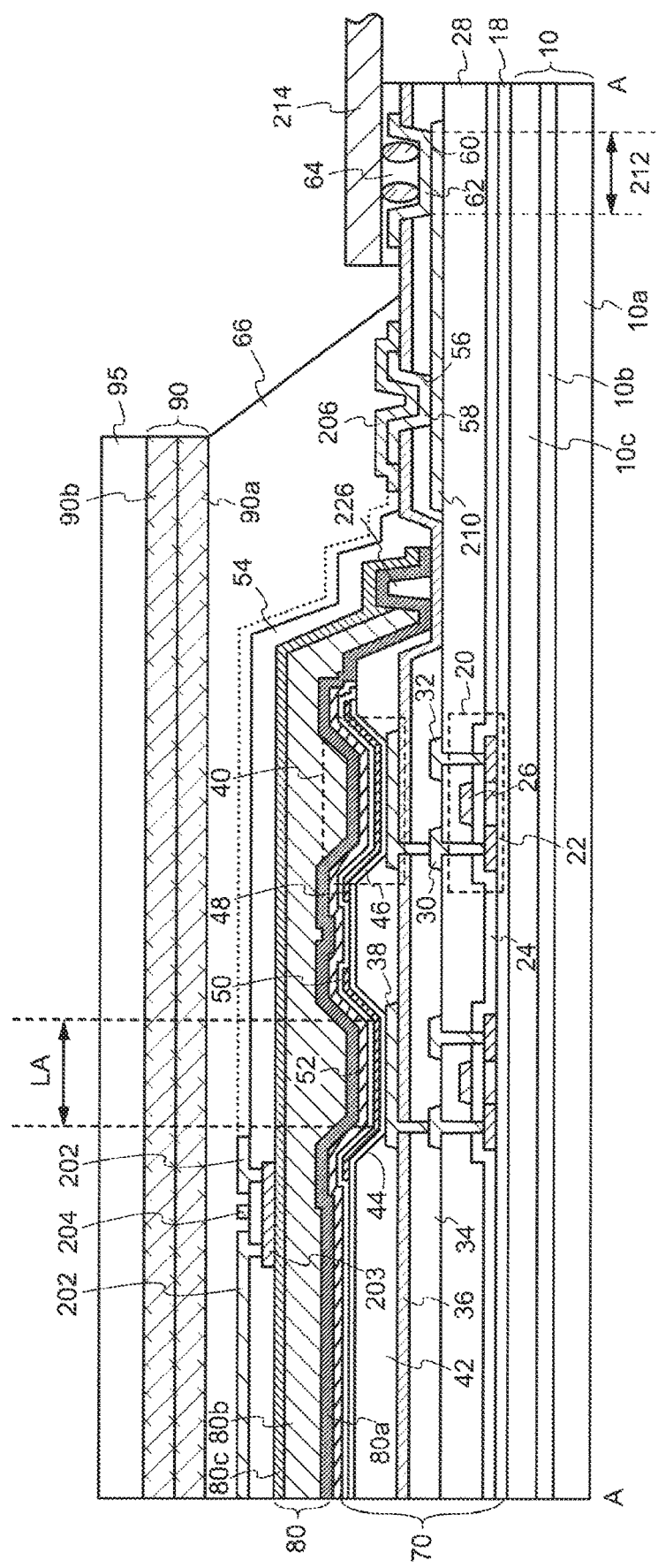
FIG. 4 is a cross-sectional view showing a structure of the display device in embodiment 1.

A pixel 108 includes a light emitting element 40 and thin film transistors (a selection transistor 15 and drive transistor 20) as is shown in FIG. 2 described later. The light emitting element 40 includes a pixel electrode (anode) 38, an organic layer (light emitting part) which includes a light emitting layer 48 formed above the pixel electrode 38, and a common electrode (cathode) 52 as is shown in FIG. 4 described later. Each of the plurality of pixels 108 is supplied with a data signal which corresponds to image data from a signal line drive circuit via the signal line 118. Next, according to the data signal, the thin film transistor which is arranged in each of the plurality of pixels 108 is driven according to the data signal and causes the light emitting element 40 to emit light according to the image data. In this way, the display region 102 can perform screen display according to the image data.

FIG. 2 is a diagram which shows a structure of a pixel circuit 108a arranged in each pixel 108 of the display device 100 according to the first embodiment. As a basic structure, one pixel circuit 108a includes a selection transistor 15, a drive transistor 20, a capacitor 25 and a light emitting element 40. Naturally, the structure of the pixel circuit 108a is not limited to the example shown in FIG. 2. In the present embodiment, the selection transistor 15 is formed by a p-channel thin film transistor, and the drive transistor 20 is formed by an n-channel thin film transistor.

As is shown in FIG. 2, a signal line 118 is connected to the source of the selection transistor 15. A scanning line 116 is connected to the gate of the selection transistor 15. The drain of the selection transistor 15 is connected to the gate of the drive transistor 20 and a first electrode which forms the capacitor 25. Furthermore, the roles of the source and the drain are switched depending on a signal which is input to the signal line 118. In addition, a power line 117 is connected to the drain of the drive transistor 20. A second electrode which forms the capacitor 25 and an anode of the light emitting element 40 are connected to the source of the drive transistor 20. The cathode of the light emitting element 40 is held at a potential lower than the potential which is applied to the power supply line 117.

In the pixel circuit 108a shown in FIG. 1, the data signal which is provided to the signal line 118 is written to the gate of the drive transistor 20 and the capacitor 25 by an on/off operation of the selection transistor 15. Next, during a light emitting period, the drive transistor 20 causes a current corresponding to the potential which is applied to the gate to flow and causes the light emitting element 40 to emit light. As described above, in the pixel circuit 108a shown in FIG. 1, it is possible to control the light emission of a light emitting element 40 by controlling the operation of the drive transistor 20 according to the data signal which is applied to the signal line 118.

Figure 3:
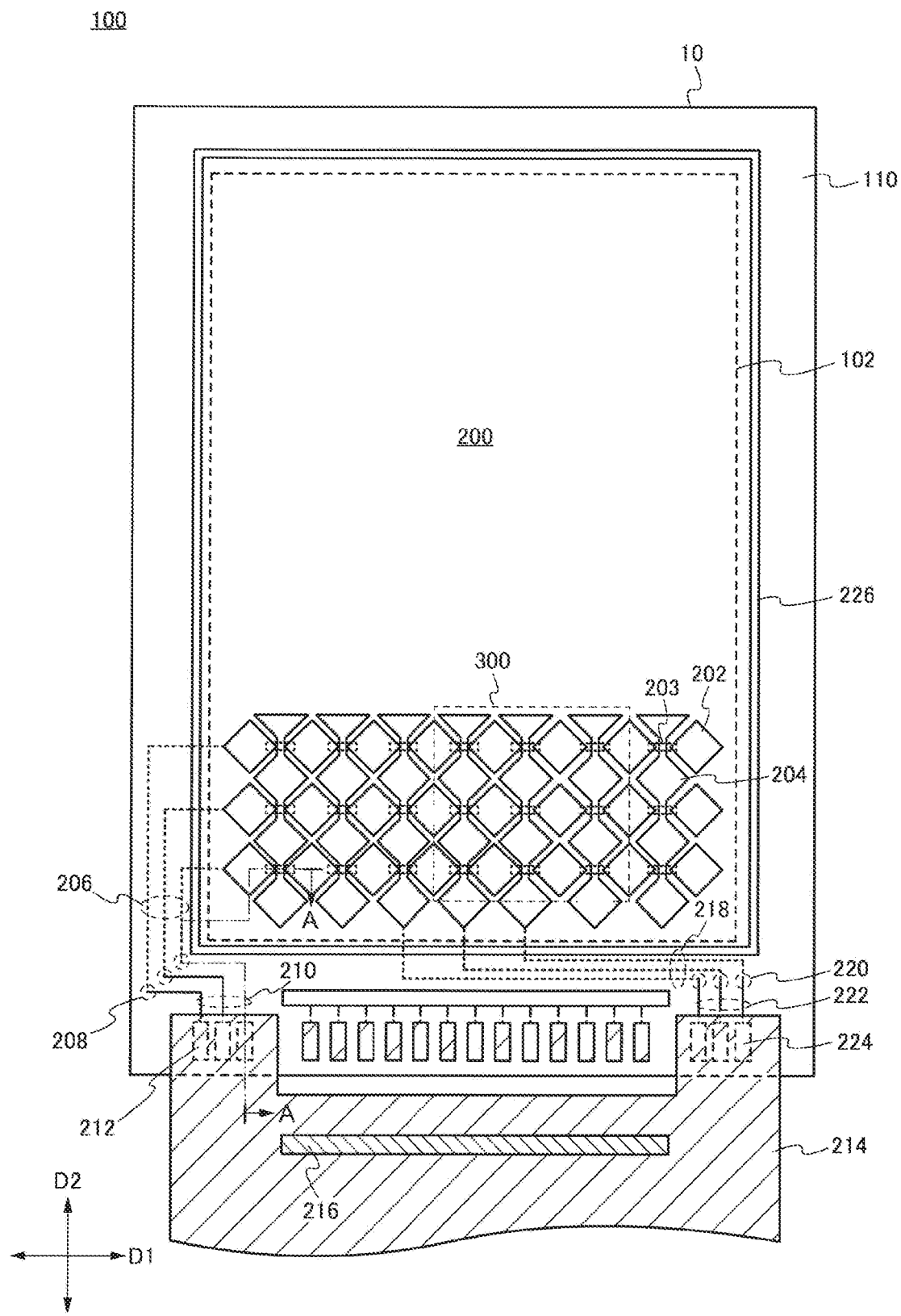
FIG. 3 is a plan view showing a structure of the display device in embodiment 1.

FIG. 3 is a plan view showing a structure of the display device 100 of the first embodiment. In particular, FIG. 3 shows a schematic structure of the touch sensor 200.

The touch sensor 200 is arranged to overlap the display region 102. The touch sensor 200 includes a plurality of sensor electrodes 202 arranged in a stripe shape in a first direction and a plurality of sensor electrodes 204 arranged in a stripe shape in a second direction. The sensor electrode 202 and the sensor electrode 204 are also called a transmission electrode (Tx) or a reception electrode (Rx) depending on their role. Each sensor electrode 202 and each sensor electrode 204 are spaced apart from each other, and these electrodes are capacitively coupled. At this time, when a human finger or the like touches the display region 102 via the sensor electrode 202 and the sensor electrode 204, the value of capacitive coupling changes. It is possible for the touch sensor 200 to determine the position of a touched finger by reading a change in the value of capacitive coupling. In this way, a so-called projection capacitive touch sensor 200 is formed using the sensor electrode 202 and the sensor electrode 204.

In the explanation below, although depicted using different hatching in order to distinguish between the sensor electrode 202 and the sensor electrode 204, the sensor electrode 202 and the sensor electrode 204 are conductive layers formed from the same material and formed in the same process.

The plurality of sensor electrodes 204 are continuously connected using the same metal material between each electrode. In other words, the plurality of sensor electrodes 204 are structures integrally formed. On the other hand, the plurality of sensor electrodes 202 are each arranged independently, and the electrodes are electrically connected by the connection wiring 203. The connection wiring 203 is formed in a different layer from the sensor electrode 202 and the sensor electrode 204. That is, the conductive layer which forms the sensor electrode 202 and the sensor electrode 204 and the conductive layer which forms the connection wiring 203 are separated via an insulating layer. A specific structure is described later.

Each sensor electrode 202 is respectively connected to a plurality of wirings 206 arranged in the periphery region 110. The plurality of wirings 206 may be formed by extending a part of the sensor electrode 202 at the furthest end of the display region 102. The plurality of wirings 206 are respectively connected to the plurality of wirings 210 via contact holes 208. One end of the plurality of wirings 210 functions as a plurality of terminals 212. The plurality of terminals 212 are connected to the flexible printed circuit substrate 214. A driver IC 216 is arranged above the flexible printed circuit substrate 214. The driver IC 216 provides a signal for driving the touch sensor 200 to each sensor electrode 202 via the plurality of terminals 212. Furthermore, the plurality of wirings 206 may also be arranged in a region which overlaps the scanning line drive circuit 104.

Similarly, each sensor electrode 204 is respectively connected to a plurality of wirings 218 which are arranged in the periphery region 110. The plurality of wirings 218 may be formed by extending a part of the sensor electrode 204 at the furthest end of the display region 102. The plurality of wirings 218 are respectively connected to the plurality of wirings 222 via contact holes 220. One end of the plurality of wirings 222 function as a plurality of terminals 224. The plurality of terminals 224 are connected to the flexible printed substrate 214. The driver IC 216 provides a signal for driving the touch sensor 200 to each sensor electrode 204 via a plurality of terminals 224. Furthermore, the plurality of terminals 114 (FIG. 1), the plurality of terminals 212 and the plurality of terminals 224 are arranged along one side of the substrate 10. In addition, a bank 226 is arranged in the periphery region 110 so as to surround the display region 102.

FIG. 4 is a cross-sectional view showing a structure of a cross section of the display device 100 according to the first embodiment. Specifically, FIG. 4 corresponds to the cross-sectional view along the dotted line A-A in FIG. 3.

As is shown in FIG. 4, the substrate 10 is formed by stacking a first resin layer 10a, an inorganic insulating layer 10b and a second resin layer 10c. It is possible to use polyimide, for example, as the first resin layer 10a and the second resin layer 10c. However, different materials may also be used for the first resin layer 10a and the second resin layer 10c, or materials other than polyimide may also be used. For example, a silicon oxide layer or a silicon nitride layer can be used as the inorganic insulating layer 10b.

A base layer 18 is arranged above the substrate 10. The base layer 18 is an insulating layer formed from an inorganic insulating material such as silicon oxide, silicon nitride or aluminum oxide. The base layer 18 is not limited to a single layer. For example, a stacked structure can be used in which a silicon oxide layer and a silicon nitride layer are combined. The structure of the base layer 18 may be appropriately determined while considering adhesion to the substrate 10 or a gas barrier property with respect to the drive transistor 20.

The drive transistor 20 is arranged above the base layer 18. Specifically, the drive transistor 20 is a thin film transistor. The structure of the drive transistor 20 may be a top gate type or a bottom gate type transistor. In the present embodiment, the drive transistor 20 includes a semiconductor layer 22 which is arranged above the base layer 18, a gate insulating layer 24 which covers the semiconductor layer 22, and a gate electrode 26 which is arranged above the gate insulating layer 24. Since the structure of the drive transistor 20 is known, a detailed explanation is omitted here. The drive transistor 20 shown in FIG. 4 is a device which controls the amount of current which flows to the light emitting element 40.

An insulating layer 28 which covers the gate electrode 26 is arranged above the drive transistor 20. A source electrode 30 and a drain electrode 32 are arranged above the insulating layer 28. The source electrode 30 and the drain electrode 32 are respectively connected to the semiconductor layer 22 via contact holes arranged in the insulating layer 28. A silicon oxide layer, a silicon nitride layer or stacked layers of these can be used as the insulating layer 28.

Furthermore, although not shown in FIG. 4, it is possible to arrange a scanning line 116 (refer to FIG. 1) formed from the same metal material as the metal material used to form the gate electrode 26 in the same layer as the gate electrode 26. The scanning line 116 is connected to the scanning line drive circuit 104. In addition, it is possible to arrange a signal line 118 which extends in a direction intersecting the scanning line 116 (refer to FIG. 1) in the same layer as the source electrode 30 and the drain electrode 32. The signal line 118 is connected to the driver IC 106 shown in FIG. 1.

A planarization layer 34 is arranged above the insulating layer 28. For example, an organic material such as polyimide, polyamide, acrylic or epoxy can be used as the planarization layer 34. Since it is possible to form these materials by a spin coating method, it is possible to planarize any lower concaves and convexities (unevenness). Although not particularly shown in the diagram, the planarization layer 34 is not limited to a single layer structure, and may be a stacked layer structure of an organic insulating layer and an inorganic insulating layer.

A protective layer 36 is arranged above the planarization layer 34. The protective layer 36 preferably includes a barrier function against moisture and oxygen. For example, a silicon nitride layer or an aluminum oxide layer can be used as the protective layer 36.

A pixel electrode 38 is arranged above the protective layer 36. The pixel electrode 38 is electrically connected to the source electrode 30 via a contact hole arranged in the planarization layer 34 and the protective layer 36. In the display device 100, the pixel electrode 38 functions as an anode which forms the light emitting element 40. The structure of the pixel electrode 38 is different depending on whether it is a top emission type or a bottom emission type electrode. In the case of a top emission type, either a metal having a high reflectance is used as the pixel electrode 38, or a stacked structure of an metal film and a transparent conductive layer having a high work function such as an indium oxide based transparent conductive layer (for example, ITO) or a zinc oxide based transparent conductive layer (for example, IZO, ZnO). In the case of a bottom emission type, the transparent conductive layers described above are used as the pixel electrode 38. In the present embodiment, a case of a top emission type is explained.

An insulating layer 42 is arranged above the pixel electrode 38. Polyimide, polyamide, acrylic, epoxy and siloxane or the like can be used as the insulating layer 42. The insulating layer 42 includes an opening 44 so that a part of the upper surface of the pixel electrode 38 is exposed. A region located on the inner side to the opening 44 in a plan view in the upper surface of the pixel electrode 38 serves as a light emitting region LA of the light emitting element 40. In addition, the insulating layer 42 is arranged between adjacent pixel electrodes 38 so as to cover an end part (edge part) of the pixel electrode 38. That is, the insulating layer 42 functions as a member which separates adjacent pixel electrodes 38 from each other. As a result, the insulating layer 42 is also generally called a "partition wall" or a "bank". It is preferred that the inner wall of the opening of the insulating layer 42 has a tapered shape. In this way, it is possible to reduce coverage defects when forming an organic layer described below.

An organic layer is arranged above the pixel electrode 38. The organic layer has a light emitting layer 48 formed from an organic material and functions as a light emitting part of the light emitting element 40. The light emitting layer 48 can emit various colors of light according to the type of organic material. That is, by arranging an organic layer including the light emitting layer 48 which emits light of different colors above adjacent pixel electrodes 38, it is possible to perform a color display combining a plurality of colors.

In the display device 100 of the present embodiment, in addition to the light emitting layer 48, a hole injection layer and/or a hole transport layer 46 and an electron injection layer and/or an electron transport layer 50 are arranged as an organic layer. The hole injection layer and/or hole transport layer 46 and the electron injection layer and/or electron transport layer 50 are arranged to overlap the plurality of pixel electrodes 38. On the other hand, the light emitting layer 48 is arranged for each of the plurality of pixel electrodes 38.

A common electrode 52 is arranged above the electron injection layer and/or the electron transport layer 50. The common electrode 52 functions as a cathode which forms the light emitting element 40. Since the display device 100 of the present embodiment has a top emission type structure, a transparent conductive layer is used as the common electrode 52. For example, MgAg alloy, ITO, IZO and ZnO or the like can be used as the material which forms the transparent conductive layer. The common electrode 52 is arranged across the plurality of pixel electrodes 38. Furthermore, although not shown in the diagram, the common electrode 52 is arranged up to the exterior of the display region 102 and is electrically connected to the terminal 114 (refer to FIG. 1) via wiring (not shown in the diagram) which is arranged in the periphery region 110.

In FIG. 4, a structure which is formed in a region where the pixel electrode 38, the hole injection layer and/or hole transport layer 46, the light emitting layer 48, the electron injection layer and/or electron transport layer 50 and the common electrode 52 overlap is called a light emitting element 40. In addition, in the display region 102, a layer arranged with a plurality of pixels 108 including a light emitting element 40, and a scanning line drive circuit 104 is called an element formation layer 70.

A sealing layer 80 is arranged above the light emitting element 40. By arranging the sealing layer 80 above the light emitting element 40, it is possible to prevent water and oxygen from entering the light emitting element 40, and thereby it is possible to reduce deterioration of the light emitting element 40. In this way, it is possible to improve the reliability of the display device 100. In the present embodiment, the sealing layer 80 has a stacked layer structure including a first inorganic insulating layer 80a, a resin layer 80b and a second inorganic insulating layer 80c. The sealing layer 80 includes a silicon nitride layer as the first inorganic insulating layer 80a and the second inorganic insulating layer 80c. In addition, the sealing layer 80 includes an acrylic resin layer as the resin layer 80b.

The connection wiring 203 is arranged above the sealing layer 80. As was explained using FIG. 3, the connection wiring 203 is wiring for mutually connecting the plurality of sensor electrodes 202 to each other. An insulating layer 54 is arranged above the connection wiring 203. In the present embodiment, a silicon nitride layer is used as the insulating layer 54. However, the insulating layer 54 is not limited to a silicon nitride layer and may be an inorganic insulating layer in addition to a silicon oxide layer or a resin layer. The sensor electrode 202 and the sensor electrode 204 explained using FIG. 3 are arranged above the insulating layer 54. As is shown in FIG. 4, adjacent sensor electrodes 202 are connected to the connection wiring 203 via a contact hole arranged in the insulating layer 54. In this way, adjacent sensor electrodes 202 are mutually and electrically connected to each other.

Furthermore, as was explained using FIG. 3, the sensor electrode 202 is electrically connected to a plurality of wirings 206 arranged in the periphery region 110. That is, a sensor electrode 202 and wiring 206 are electrically connected also in FIG. 4. However, since a part of the wiring 206 appears in a cross-section cut along the dotted line A-A in FIG. 4, a part of the sensor electrode 202 and a part of the wiring 206 are omitted from the diagram.

The wiring 206 is electrically connected to the conductive layer 58 via a contact hole 56 arranged in the planarization layer 34 and the protective layer 36. Since the conductive layer 58 is a transparent conductive layer which is formed in the same process as the pixel electrode 38, the conductive layer 58 is formed from the same material as the pixel electrode 38. The conductive layer 58 is connected to the wiring 210 via a contact hole 56. As described above, the wiring 206 is electrically connected to the wiring 210 via a conductive layer 58.

The wiring 210 is exposed to the exterior near the end part of the periphery region 110. An exposed part of the wiring 210 functions as a terminal 212. Specifically, it is connected to the flexible printed circuit substrate 214 via a conductive layer 62 which is arranged in the contact hole 60 arranged in the planarization layer 34 and the protective layer 36, and via an anisotropic conductive film 64.

In addition, a bank 226 is arranged above the protective layer 36 in the periphery region 110. The bank 226 is arranged to surround at least the display region 102. Furthermore, the bank 226 may also be arranged to surround the display region 102 and the scanning line drive circuit 104. The bank 226 functions to stop the resin layer 80b from spreading in a horizontal direction. In addition, when the first inorganic insulating layer 80a and the second inorganic insulating layer 80c contact each other above the bank 226, it is possible to suppress the entry of moisture and oxygen through the resin layer 80b. In this way, since it is possible to suppress the entrance of moisture and oxygen to the light emitting element 40, it is possible to reduce deterioration of the light emitting element 40. As a result, it is possible to improve the reliability of the display device 100.

Furthermore, the display device 100 of the present embodiment is arranged with an adhesive material 66 to cover the display region 102 and a connection region (region where the contact hole 56 is located) between the sensor electrode 204 and the wiring 210. Although a known adhesive material can be used as the adhesive material 66, for example, it is possible to use a resin material. The adhesive material 66 may include water-absorbing substances such as calcium and zeolite. By including a water-absorbing substance in the adhesive material 66, it is possible to delay the arrival of moisture to the light emitting element 40 even when moisture enters the display device 100.

A circularly polarizing plate 90 is arranged above the display region 102 using the adhesive material 66. The circularly polarizing plate 90 in the present embodiment has a stacked layer structure including a ¼ wavelength plate 90a and a linearly polarizing plate 90b. By adopting this structure, it is possible to emit light from the light emitting region LA to the exterior from the display side surface of the substrate 95.

Figure 5:
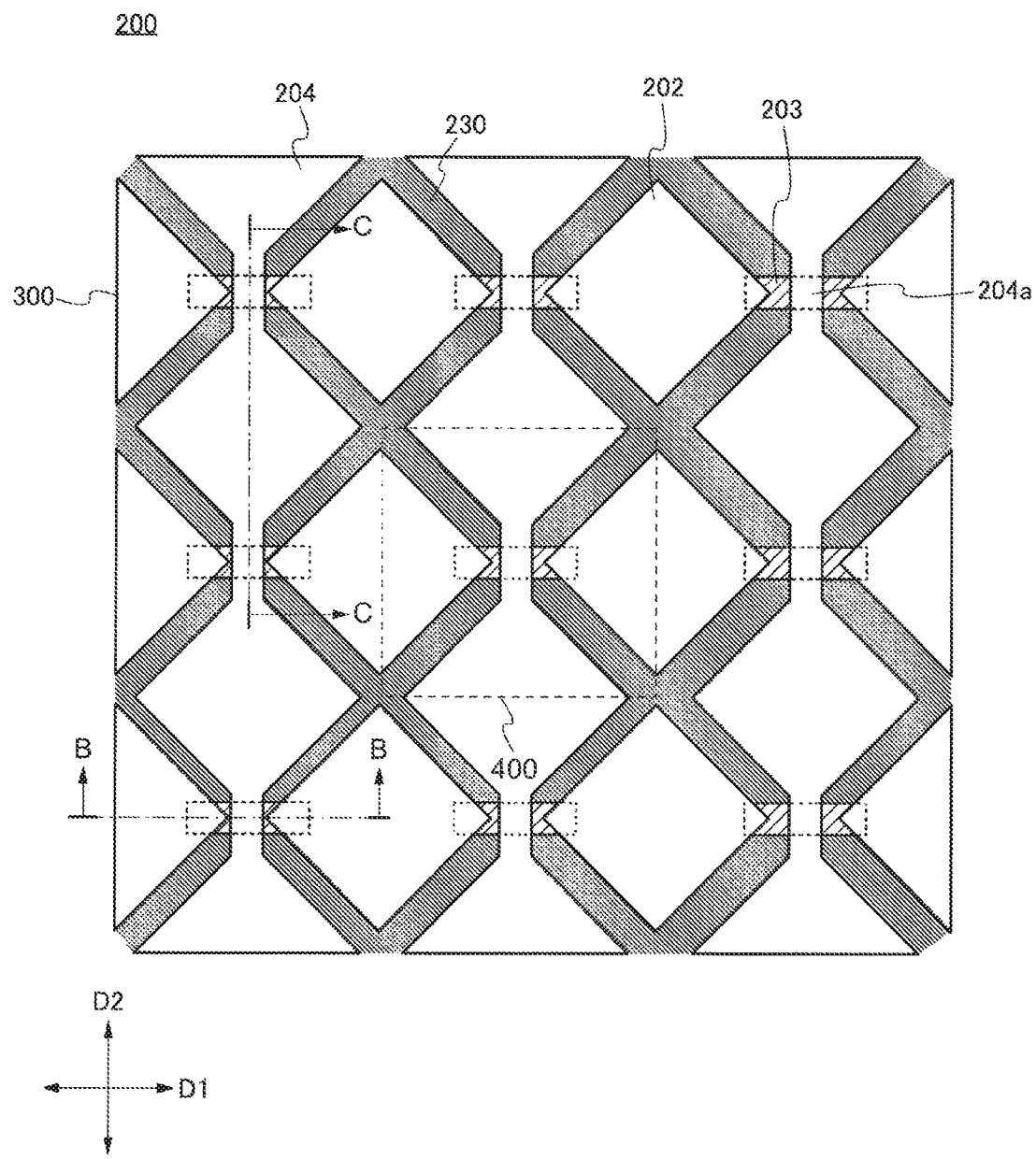
FIG. 5 is a plan view showing a schematic structure of a touch sensor in the display device in embodiment 1.

Next, a specific structure of the touch sensor 200 is explained. FIG. 5 is a plan view showing a schematic structure of the touch sensor 200 in the display device 100 according to the first embodiment. Specifically, FIG. 5 corresponds to an expanded view of a range surrounded by a frame line 300 in the touch sensor 200 shown in FIG. 3.

As is shown in FIG. 5, the plurality of sensor electrodes 204 are arranged aligned in a second direction (D2 direction). A connecting part 204a which connects the plurality of sensor electrodes 204 is formed from the same metal material as the sensor electrode 204. Therefore, the plurality of sensor electrodes 204 are formed as one structure continuously connected. The plurality of sensor electrodes 202 are arranged aligned in a first direction (D1 direction). The plurality of sensor electrodes 202 are spaced apart from each other. As was described above, the plurality of sensor electrodes 202 and the plurality of sensor electrodes 204 are formed in the same layer respectively. As a result, pairs of sensor electrodes 202 cannot be connected to each other by wiring which intersects the connecting part 204a.

In the present embodiment, pairs of the sensor electrodes 202 are connected to each other by a connection wiring 203 which is formed in a different layer the sensor electrode 202 and the sensor electrode 204. That is, adjacent sensor electrodes 202 are connected by a bridge structure using the connection wiring 203. In this way, it is possible to arranged and align the plurality of sensor electrodes 202 and the plurality of sensor electrodes 204 aligned in different directions without mutually electrically contacting each other. In this way, in the present embodiment, since it is possible to arrange the sensor electrode 202 and the sensor electrode 204 in the same layer, it is possible to make the optical characteristics, such as a reflection characteristic of both electrodes substantially the same. As a result, it is possible to make the sensor electrode 202 and the sensor electrode 204 difficult to be visually recognized by a user.

As is shown in FIG. 5, the touch sensor 200 which is included in the display device 100 of the present embodiment includes a light shielding layer 230 which fills gaps between the plurality of sensor electrodes 202 and the plurality of sensor electrodes 204 in a plan view. Specifically, the light shielding layer 230 is arranged in a different layer from the sensor electrode 202 and the sensor electrode 204 (that is, the same layer as the connection wiring 203), and fills a gap between each sensor electrode 202 and each sensor electrode 204 in a plan view.

As is described above, a gap is provided between the electrodes in the on-cell touch sensor by arranging a plurality of electrodes in the same layer. Therefore, there is a problem whereby an unintended pattern becomes visible since light is visually recognized only in the gap between the electrodes which reduces the visibility of the touch sensor. Therefore, in the present embodiment, a structure is provided in which the gap between the electrodes in a plan view, that is, the gap between each sensor electrode 202 and each sensor electrode 204, is shielded by the light shielding layer 230. As a result, it is possible to solve a problem whereby light which leaks from the gap between the electrodes and an unintended pattern is visible.

Figure 6A:
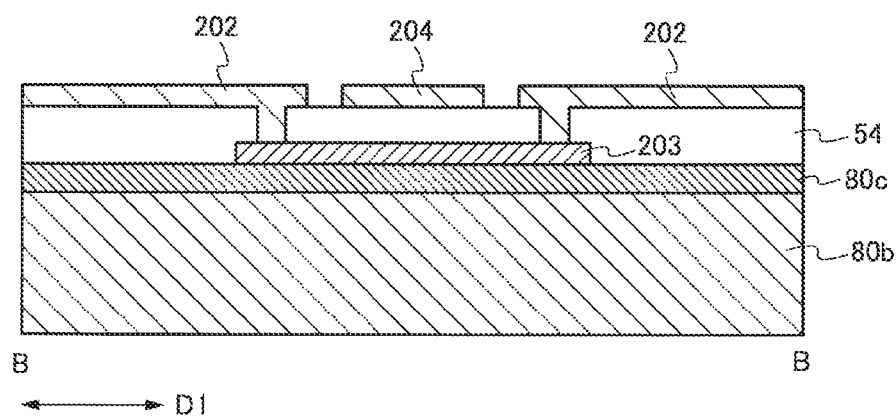
FIG. 6A is a cross-sectional view showing a structure of the touch sensor in the display device in embodiment 1.
Figure 6B:
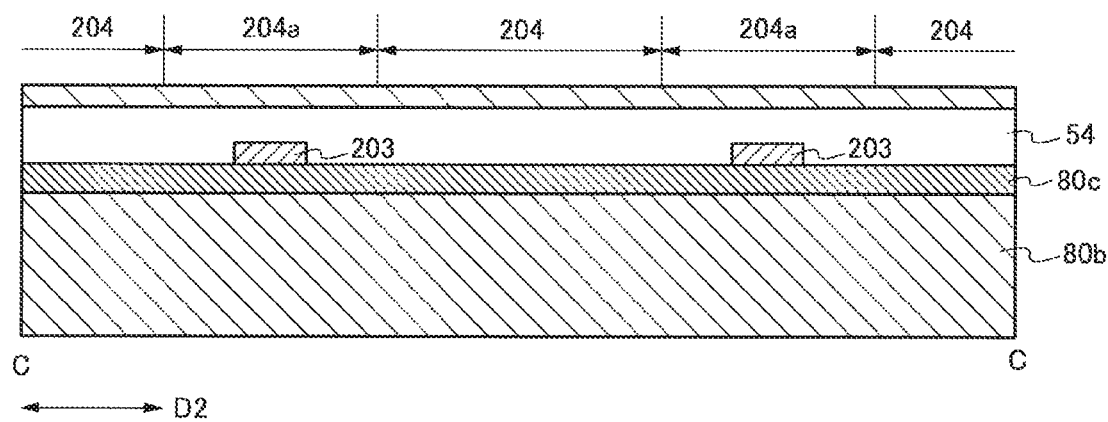
FIG. 6B is a cross-sectional view showing a structure of the touch sensor in the display device in embodiment 1.

FIG. 6A and FIG. 6B are cross-sectional views showing a structure of the touch sensor 200 in the display device 100 of the first embodiment. Specifically, FIG. 6A corresponds to an expanded view of a cross section cut along the dotted line shown by B-B in FIG. 5. FIG. 6B corresponds to an expanded view of a cross section cut along the dotted line C-C shown in FIG. 5. Furthermore, only parts above the resin layer 80b which is the sealing layer 80 explained using FIG. 4 and the second inorganic insulating layer 80c are shown in FIG. 6A and FIG. 6B. In addition, a cover glass and the like which is arranged further above the touch sensor 200 is also omitted.

As is shown in FIG. 6A and FIG. 6B, connection wiring 203 is arranged above the second inorganic insulating layer 80c. The connection wiring 203 is covered by an insulating layer 54. A sensor electrode 202 and a sensor electrode 204 are arranged above the insulating layer 54. At this time, as is shown in FIG. 6A, the sensor electrode 202 is electrically connected to the connection wiring 203 via an opening part (contact hole) which is arranged in the insulating layer 54. By adopting such a bridge structure, adjacent sensor electrodes 202 are electrically connected via the connection wiring 203.

Figure 7:
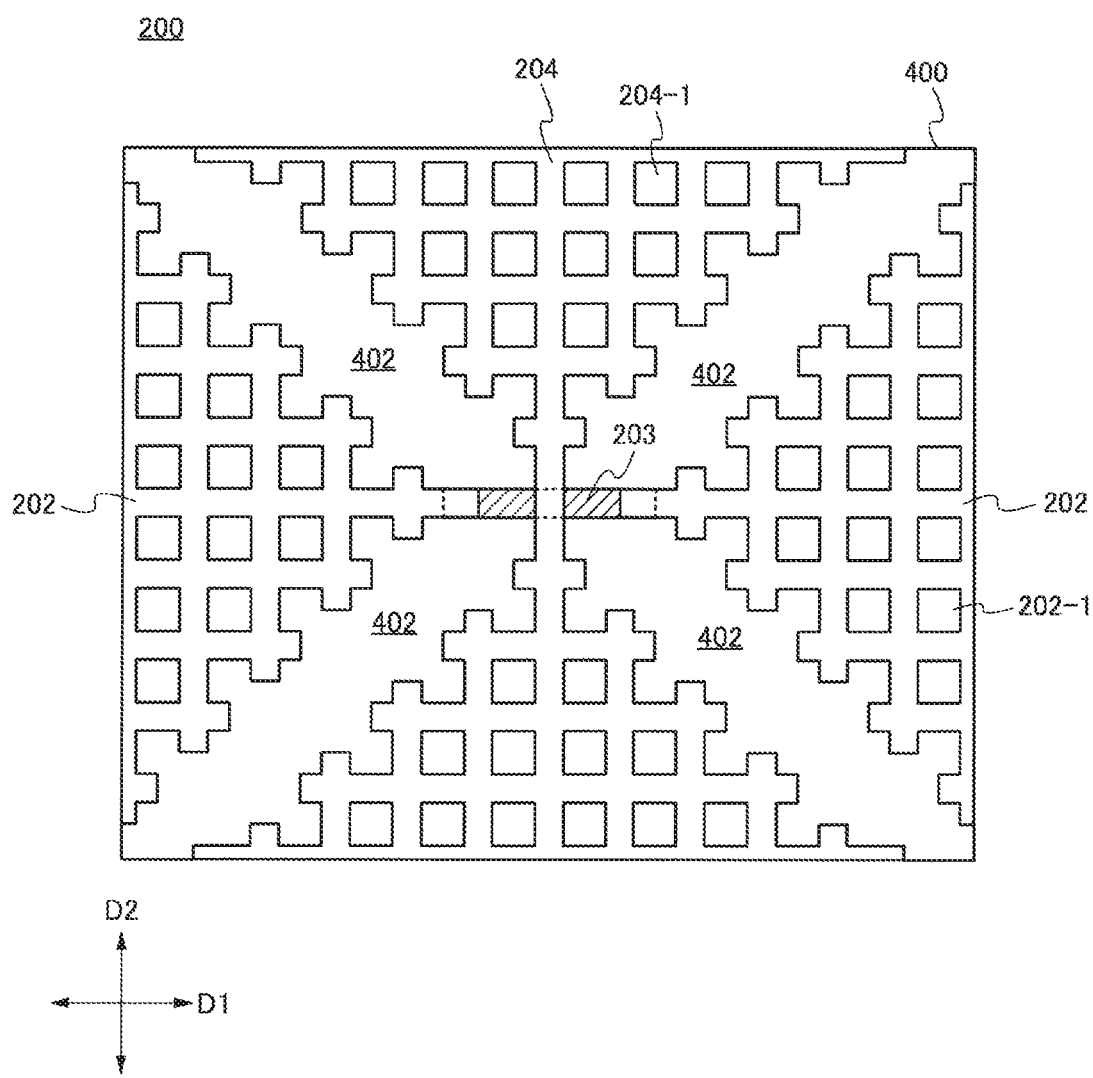
FIG. 7 is a plan view showing a structure of the touch sensor in the display device in embodiment 1.
Figure 8:
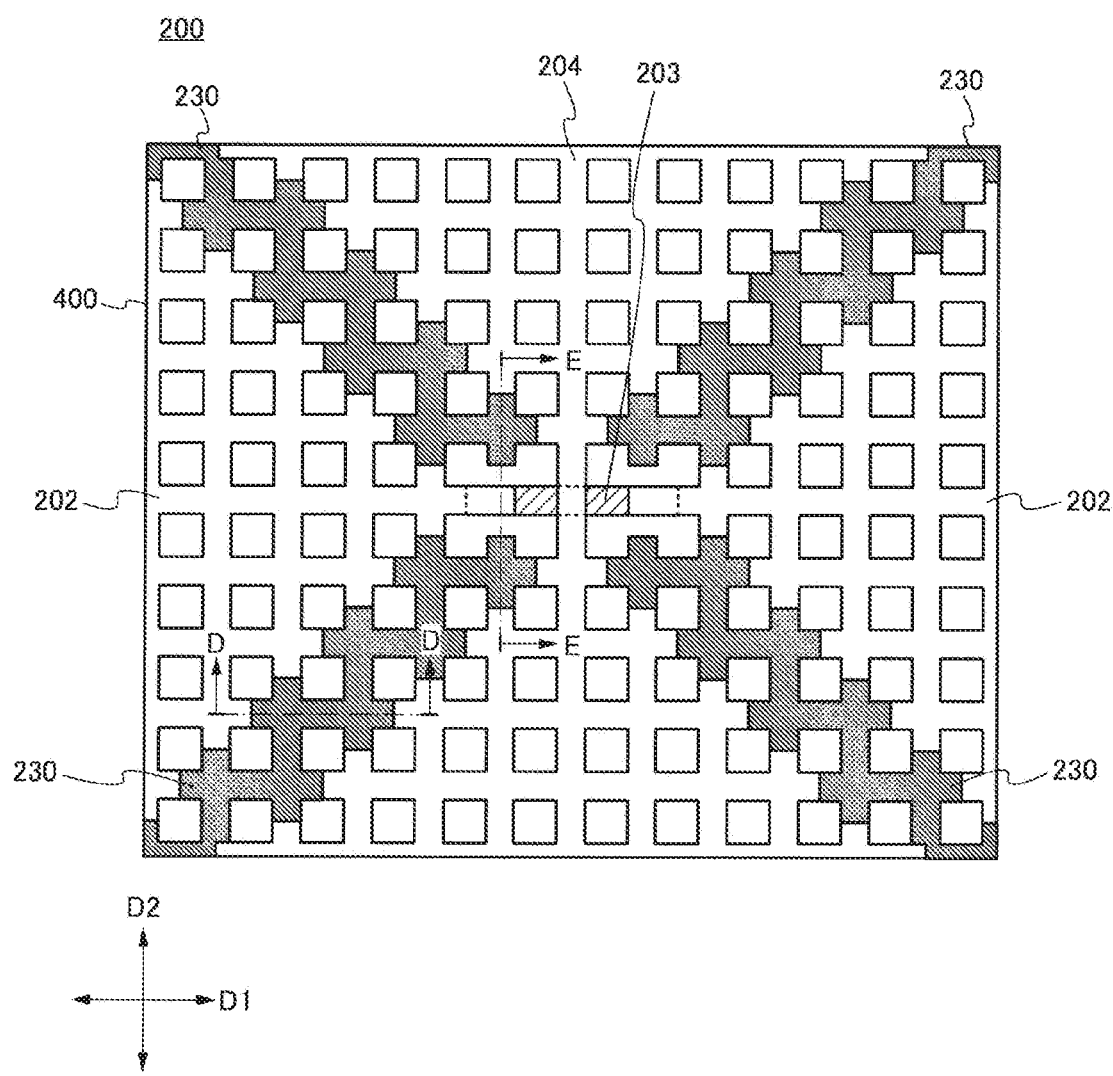
FIG. 8 is a plan view showing a structure of the touch sensor in the display device in embodiment 1.

Next, a more specific structure of a region surrounded by a frame line 400 in the plan view shown in FIG. 5 is explained. FIG. 7 and FIG. 8 are plan views showing a structure of the touch sensor 200 in the display device 100 according to the first embodiment. However, FIG. 7 shows a structure in which the light shielding layer 230 is omitted from the touch sensor 200. FIG. 8 shows a structure in which the light shielding layer 230 is included in the touch sensor 200.

As is shown in FIG. 7, the sensor electrode 202 and the sensor electrode 204 are formed by a plurality of wirings which are arranged in a first direction (D1 direction) and a second direction (D2 direction). That is, for example, the sensor electrode 202 is formed by a plurality of wirings arranged in a lattice shape and has a mesh shaped appearance in a plan view. Similarly, the sensor electrode 204 is also formed by a plurality of wirings arranged in a lattice shape 0 and has a mesh shaped appearance in a plan view. The width of the wiring which forms the sensor electrode 202 and the sensor electrode 204 is 1 μm or more and 10 μm or less (preferably 2 μm or more and 8 μm or less). In the present embodiment, the width of the wiring which forms the sensor electrode 202 and the sensor electrode 204 is 5 μm.

As described above, the sensor electrode 202 and the sensor electrode 204 are formed from a plurality of wirings arranged in a lattice shape. As a result, the sensor electrode 202 has a plurality of opening parts 202-1 which are surrounded by wiring. Similarly, the sensor electrode 204 has a plurality of opening parts 204-1 which are surrounded by wiring. At this time, the plurality of opening parts 202-1 and the plurality of opening parts 204-1 correspond respectively to the positions of the pixels 108 in a plan view. That is, the light which is emitted from the light emitting element 40 included in a pixel 108 is recognized by a user via the plurality of opening parts 202-1 and the plurality of opening parts 204-1.

In addition, as is shown in FIG. 7, the sensor electrode 202 is electrically connected by the connection wiring 203 which is arranged in a different layer from the sensor electrode 202. As described above, the sensor electrode 202 and the connection wiring 203 are connected via an opening part arranged in the insulating layer 54. Furthermore, although the width of the connection wiring 203 and the width of the wiring which forms the sensor electrode 202 are shown as the same width in FIG. 7, the present invention is not limited to this. For example, the width of the connection wiring 203 may be wider than the width of the wiring which forms the sensor electrode 202. In addition, although adjacent sensor electrodes 202 are connected by one connection wiring 203 in FIG. 7, they may also be electrically connected via a plurality of connection wirings 203. Similarly, although adjacent sensor electrodes 204 are connected to each other by one connecting part 204a in FIG. 7, they may also be connected via a plurality of connecting parts 204a.

As is shown in FIG. 7, there is a gap 402 between the sensor electrode 202 and the sensor electrode 204 in the case when the light shielding layer 230 is not arranged. This gap 402 causes a user to recognize an unintended pattern due to light leakage.

Therefore, in the present embodiment, the light shielding layer 230 is arranged at the position of the gap 402 as is shown in FIG. 8. The light shielding layer 230 is formed by a plurality of wirings similar to the sensor electrode 202 and the sensor electrode 204. However, the wiring which forms the light shielding layer 230 is located in a different layer from the wiring which forms the sensor electrode 202 and the sensor electrode 204. That is, the sensor electrode 202 and the sensor electrode 204 are formed by wiring included in a first layer, and the light shielding layer 230 is formed by wiring included in a second layer which is different from the first layer. Furthermore, in the present embodiment, the wiring which forms the light shielding layer 230 and the connection wiring 203 are located in the same layer. Therefore, according to the present embodiment, an additional process is not necessary when arranging the light shielding layer 230, and the light shielding layer 230 can be formed in the same process as the formation of the connection wiring 203. However, the present invention is not limited to this structure and the wiring which forms the light shielding layer 230 and the connection wiring 203 may also be in different layers.

In addition, in the present embodiment, the sensor electrode 202 and the sensor electrode 204 which are formed by the wiring included in the first layer and the light shielding layer 230 which is formed by the wiring included in the second layer are formed by the same metal material. As a result, the surface of the sensor electrode 202 and the sensor electrode 204 and the surface of the light shielding layer 230 have the same reflectance. In this way, by aligning the reflectances between the surfaces of the sensor electrode 202 and the sensor electrode 204 and the surface of the light shielding layer 230, it is possible to prevent an unintended pattern being recognized due to the reflection method. In this way, it is preferred that the surface of the wiring which is included in the first layer and the surface of the wiring which is included in the second layer are made of the same metal material.

Figure 9A:
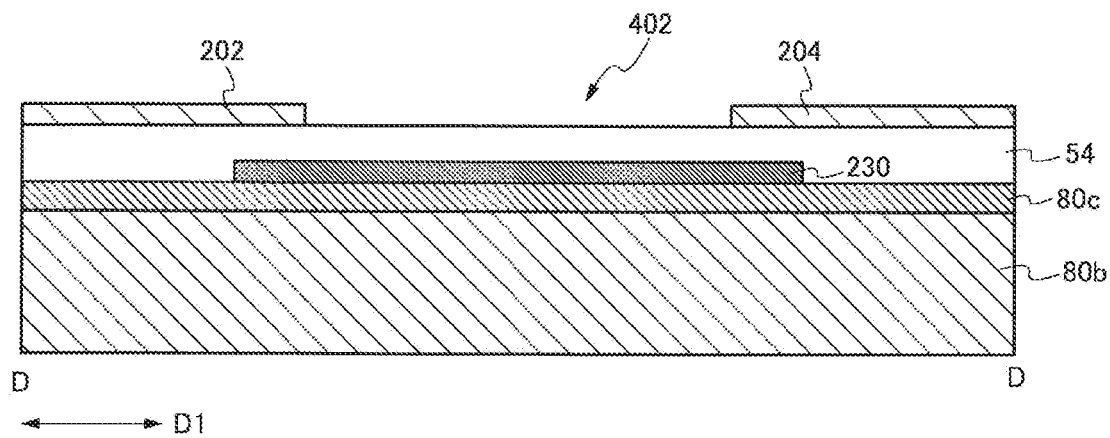
FIG. 9A is a cross-sectional view showing a structure of the touch sensor in the display device in embodiment 1.
Figure 9B:
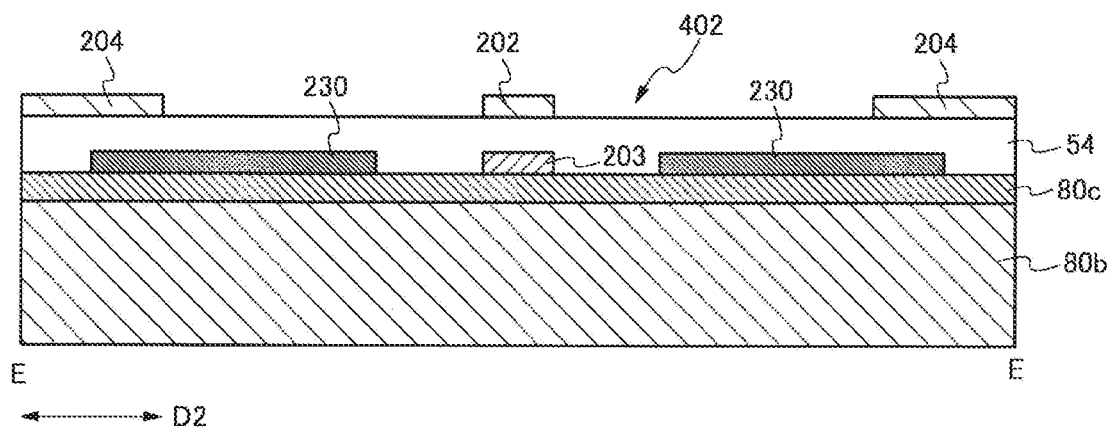
FIG. 9B is a cross-sectional view showing a structure of the touch sensor in the display device in embodiment 1.

FIG. 9A corresponds to an expanded view of a cross section cut along the dotted line shown by D-D in FIG. 8. FIG. 9B corresponds to an expanded view of a cross section cut along the dotted line shown by E-E in FIG. 8. Furthermore, only parts above the resin layer 80b which is a part of the sealing layer 80 explained using FIG. 4, and above the second inorganic insulating layer 80c are shown in FIG. 9A and FIG. 9B. In addition, a cover glass or the like which is arranged above the touch sensor 200 is also omitted.

In the cross-sectional view shown in FIG. 9A, the light shielding layer 230 is shown above the second inorganic insulating layer 80c. As is shown in FIG. 9A, the light shielding layer 230 is arranged to overlap the gap 402 between the sensor electrode 202 and the sensor electrode 204 in a plan view. In addition, the end part of the light shielding layer 230 overlaps with the end parts of the sensor electrode 202 and the sensor electrode 204. Since the light shielding layer 230 is arranged in order to prevent light in an oblique direction from leaking, it is preferred that the end parts of the light shielding layer 230 overlap the end parts of the sensor electrode 202 and the sensor electrode 204. However, it is possible to suppress light leaking by arranging the light shielding layer 230 to overlap the gap 402. Therefore, the effect of the present embodiment is not lost even if the end part of the light shielding layer 230 and the end part of the sensor electrode 202 and the sensor electrode 204 do not overlap.

In the cross-sectional view shown in FIG. 9B, the connection wiring 203 and the light shielding layer 230 are shown above the second inorganic insulating layer 80c. A part of the wiring which forms the sensor electrode 202 is arranged above the connection wiring 203. The light shielding layer 230 is arranged to overlap a part of the wiring which forms the sensor electrode 204 in a plan view. Furthermore, in the present embodiment, the connection wiring 203 and the wiring which forms the light shielding layer 230 are arranged in the same layer (specifically, above the second inorganic insulating layer 80c). As a result, a predetermined gap is arranged between the connection wiring 203 and the wiring which forms the light shielding layer 230 so that short circuits do not occur.

In the examples shown in FIG. 9A and FIG. 9B, the "first layer" described above is a layer in which the sensor electrode 202 and the sensor electrode 204 are arranged (that is, a layer arranged above the insulating layer 54), and the "second layer" described above is a layer in which the connection wiring 203 and the light shielding layer 230 are arranged (that is, a layer arranged above the second inorganic insulating layer 80c). In the present embodiment, although the second layer is positioned on a lower layer than the first layer, this may also be reversed. That is, it is possible to arrange the sensor electrode 202 and the sensor electrode 204 above the second inorganic insulating layer 80c, and it is possible to arrange the connection wiring 203 and the light shielding layer 230 above the insulating layer 54.

The display device 100 of the present embodiment explained above is arranged with the touch sensor 200 including a plurality of sensor electrodes 202 and a plurality of sensor electrodes 204 above the display region 102 which includes a plurality of pixels 108. The touch sensor 200 has a structure in which a light shielding layer 230 which is arranged in a different layer from the sensor electrode 202 and the sensor electrode 204 overlaps a gap 402 which exists between the sensor electrode 202 and the sensor electrode 204. In this way, in the case when the touch sensor 200 is seen from an oblique direction, it is possible to solve the problem whereby light which leaks from the gap 402 is recognized and an unintended pattern is seen. As a result, it is possible to provide the display device 100 including the touch sensor 200 with good visibility.

Second Embodiment

In the present embodiment, a case of an example where the structure of a light shielding layer is different from the first embodiment is explained. In the present embodiment, parts which are common to the display device 100 of the first embodiment are attached with the same reference numerals and explanations of these parts are omitted.

Figure 10:
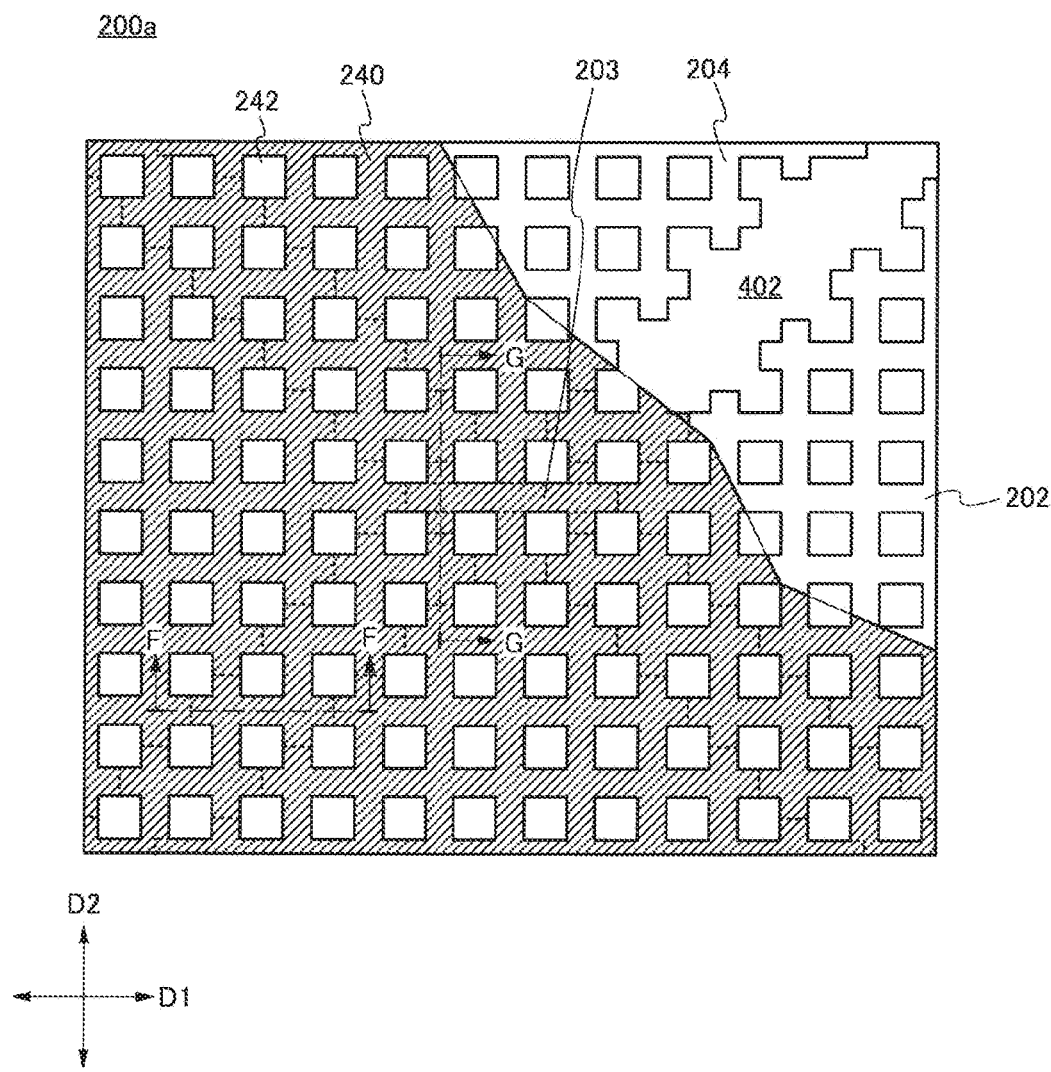
FIG. 10 is a plan view showing a structure of a touch sensor in a display device in embodiment 2.
Figure 11A:
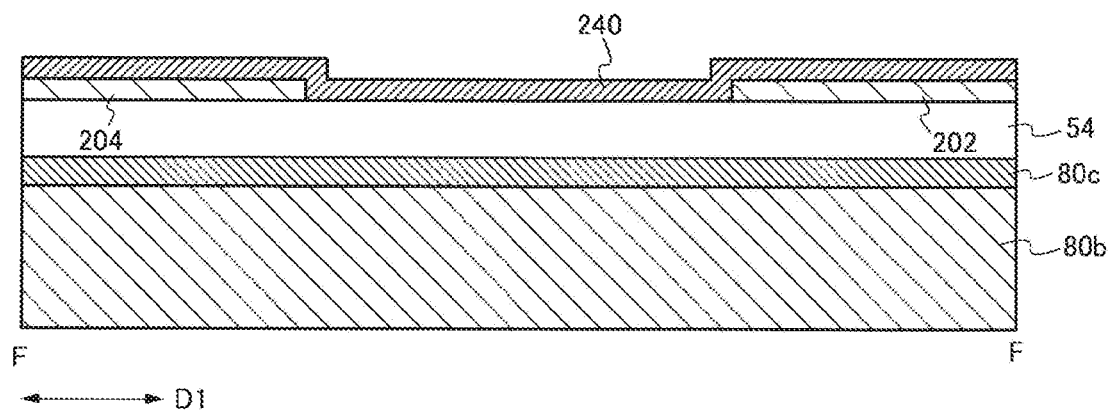
FIG. 11A is a cross-sectional view showing a structure of the touch sensor in the display device in embodiment 2.
Figure 11B:
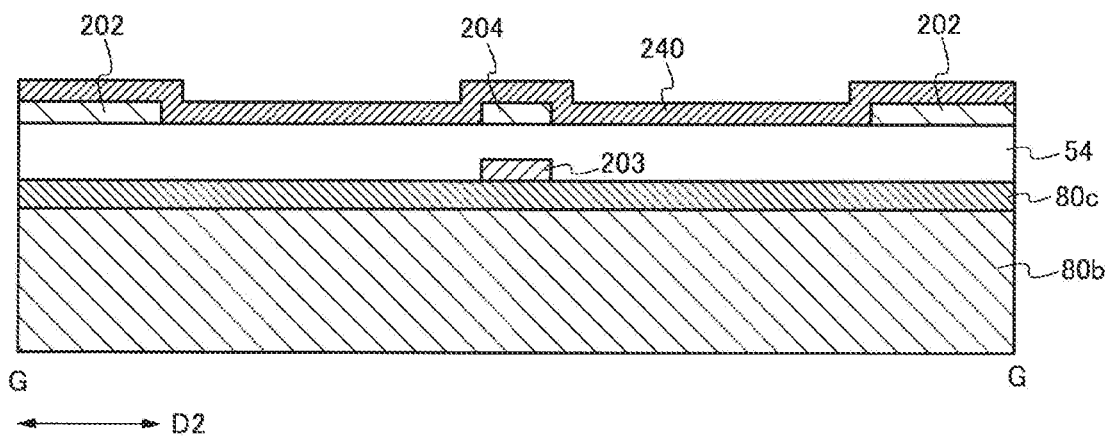
FIG. 11B is a cross-sectional view showing a structure of the touch sensor in the display device in embodiment 2.

FIG. 10 is a plan view showing a structure of a touch sensor 200a in the display device of the second embodiment. FIG. 11A corresponds to an expanded view of a cross section cut along the dotted line shown by F-F in FIG. 10. FIG. 11B corresponds to an expanded view of a cross section cut along the dotted line shown by G-G in FIG. 10. Furthermore, only parts above the resin layer 80b which is a part of the sealing layer 80 explained using FIG. 4, and the second inorganic insulating layer 80c are shown in FIG. 11A and FIG. 11B. In addition, a cover glass and the like which is arranged above the touch sensor 200a is also omitted.

As is shown in FIG. 11A and FIG. 11B, in the present embodiment, a light shielding layer 240 is arranged above the sensor electrode 202 and the sensor electrode 204. The light shielding layer 240 has insulating properties. For example, the light shielding layer 240 is formed from a resin material including a black pigment. Of course, a substance other than a black pigment may also be used as the light shielding layer 240 as long as it can have light shielding properties or another insulating material may also be used instead of the resin material.

In addition, as is shown in FIG. 10, in the present embodiment, the light shielding layer 240 is arranged along wiring which forms the sensor electrode 202 and the sensor electrode 204. The light shielding layer 240 is arranged in a lattice shape in the gap 402 between the sensor electrode 202 and the sensor electrode 204. Therefore, the light shielding layer 240 in a plan view has an appearance in which the opening parts 241 are arranged in a matrix shape in the first direction (D1 direction) and the second direction (D2 direction). Furthermore, although the width of the wiring part which forms the light shielding layer 240 and the width of the wiring which forms the sensor electrode 202 and the sensor electrode 204 are substantially the same in FIG. 10, they may also be different widths.

According to the present embodiment, it is possible to arrange the light shielding layer 240 with a high degree of freedom according to the structure of the touch sensor 200a. In other words, regardless of how much the structure (for example, shape or layout) of the sensor electrode 202 and the sensor electrode 204 change, since it is sufficient to just form the light shielding layer 240 having opening parts in a matrix shape so as to overlap the sensor electrode 202, the sensor electrode 204 and the gap 402, there is an effect whereby the specifications can be easily changed.

Third Embodiment

In the present embodiment, a structure for obtaining a light shielding effect by arranging a plurality of wirings is explained instead of a structure in which a light shielding layer is arranged in a gap between the sensor electrode 202 and the sensor electrode 204. Furthermore, in the present embodiment, the same reference symbols are attached to parts which are common to the display device 100 of the first embodiment and an explanation thereof is omitted.

Figure 12:
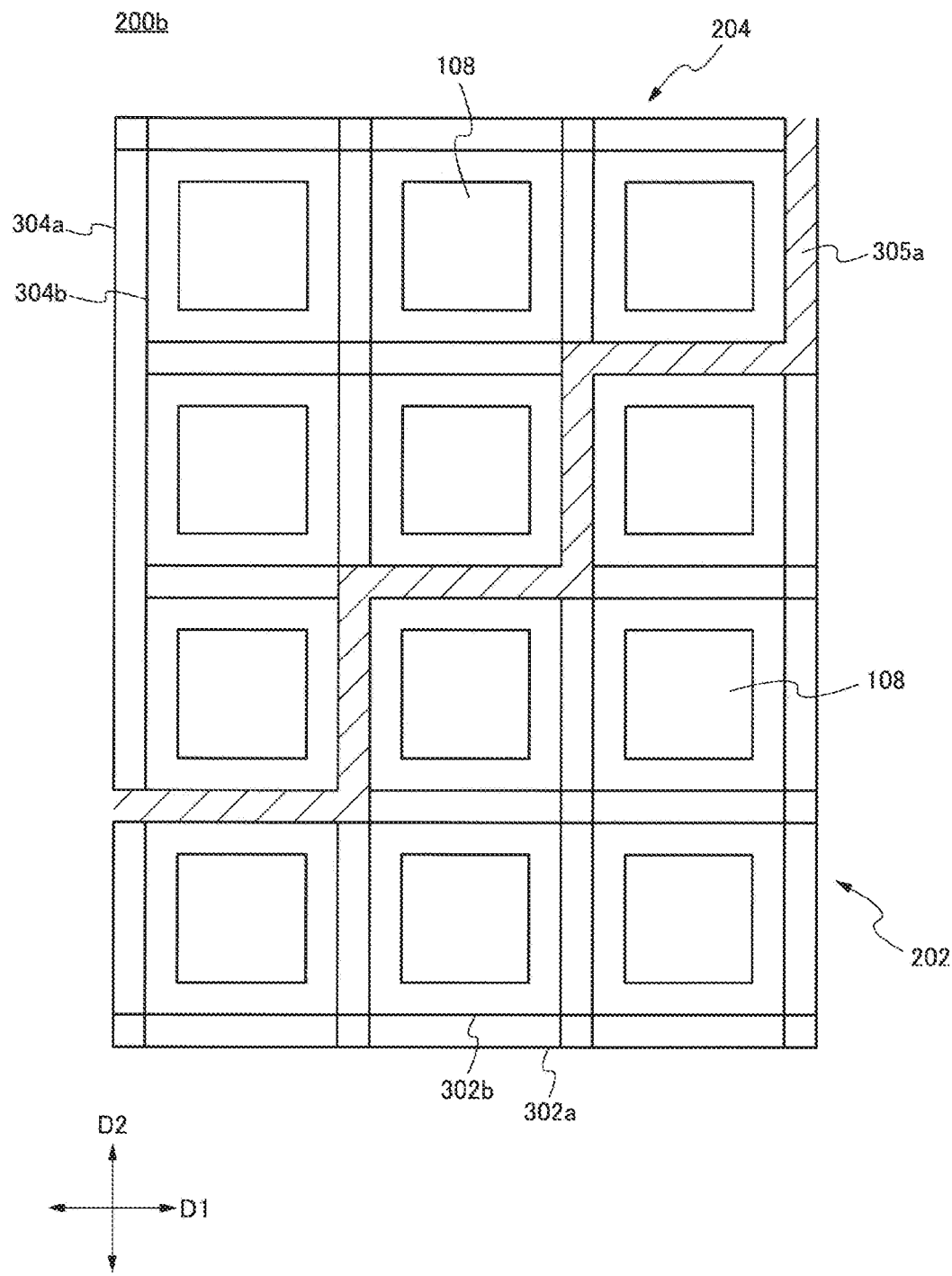
FIG. 12 is a plan view showing a structure of a touch sensor in a display device in embodiment 3.
Figure 13:
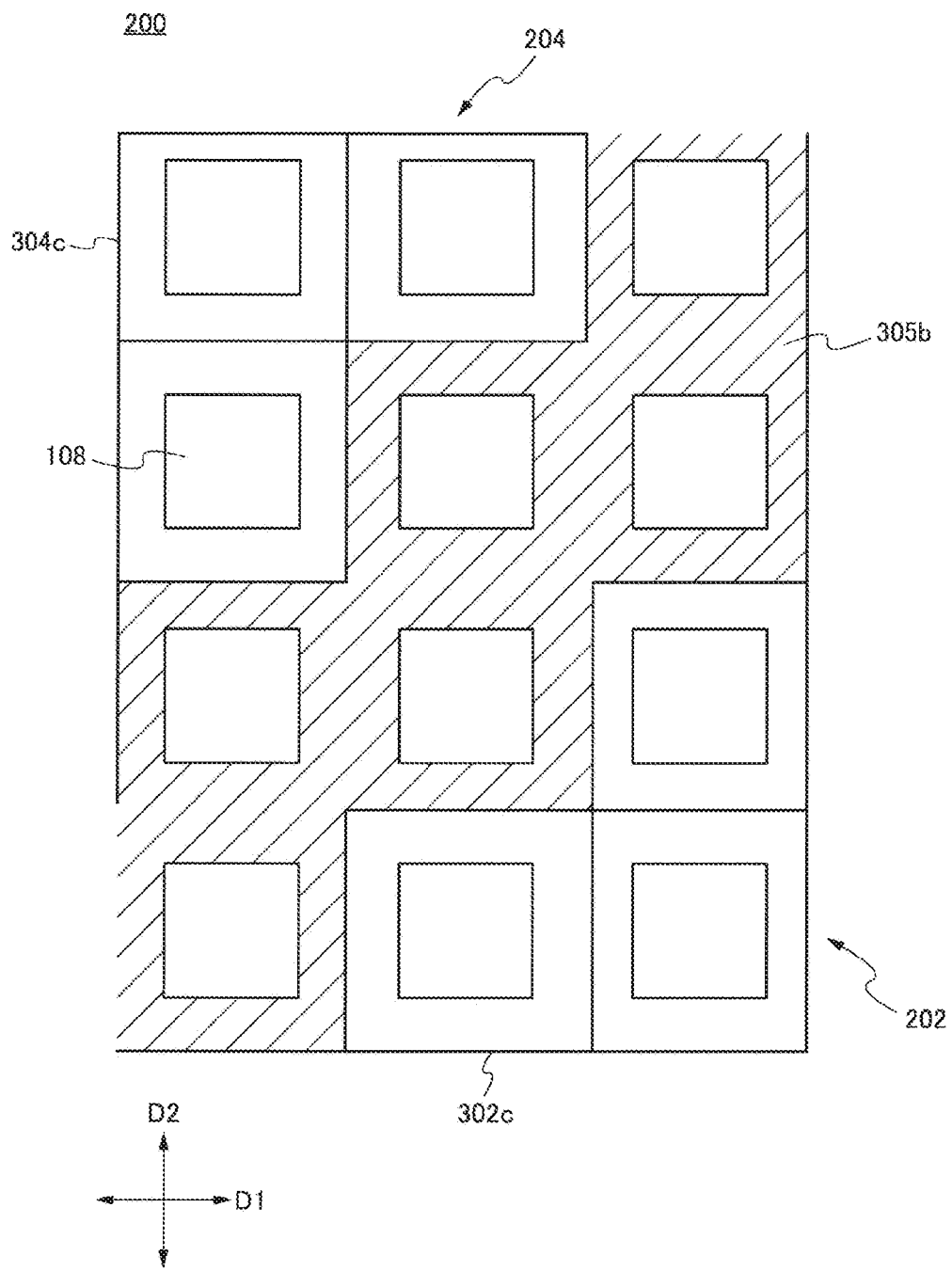
FIG. 13 is a plan view showing a structure of the touch sensor in the display device in embodiment 3.

FIG. 12 is a plan view showing the structure of a touch sensor 200b in the display device of the third embodiment. FIG. 13 is a plan view showing a structure of the touch sensor 200 in the display device 100 according to the first embodiment. However, since it is used as a comparative example in the present embodiment, a depiction of the light shielding layer 230 is omitted in FIG. 13.

As is shown in FIG. 12, the wirings which form the sensor electrode 202 and the sensor electrode 204 in the touch sensor 200b of the present embodiment are each arranged in double. That is, two wirings are arranged between each pixel 108. However, the number of wirings which are arranged is not limited to two and three or more may also be arranged.

In the example shown in FIG. 12, the sensor electrode 202 is formed by arranging a wiring 302a and a wiring 302b between the pixels 108. The sensor electrode 204 is formed by arranging a wiring 304a and a wiring 304b between the pixels 108. At this time, the sensor electrode 202 and the sensor electrode 204 are electrically separated by a gap 305a between them.

On the other hand, the sensor electrode 202 is formed by arranging the wiring 302c between the pixels 108 in the example shown in FIG. 13. The sensor electrode 204 is formed by arranging the wiring 304c between the pixels 108. At this time, the sensor electrode 202 and the sensor electrode 204 are electrically separated by a gap 305b between them.

According to the example which is shown in FIG. 12, since the two wirings 302a and 302b or the two wirings 304a and 304b are arranged between each pixel 108, the gap 305a between the sensor electrode 202 and the sensor electrode 204 becomes substantially narrow. Compared to the example which is shown in FIG. 13, it can be understood that the area of the gap 305a in the touch sensor 200b is narrower than the area of the gap 305b in the touch sensor 200.

As is described above, even if a light shielding layer is not separately arranged from the sensor electrode 202 and the sensor electrode 204, it is possible to substantially fill the gap 402 between the sensor electrode 202 and the sensor electrode 204 by increasing the number of wirings which form the sensor electrode 202 and the sensor electrode 204.

Fourth Embodiment

In the present embodiment, a case where the structure of a sensor electrode and a light shielding layer are used an example different from that of the first embodiment is explained. Furthermore, in the present embodiment, the same reference symbols are attached to parts which are common to the display device 100 of the first embodiment and an explanation thereof is omitted.

Figure 14:
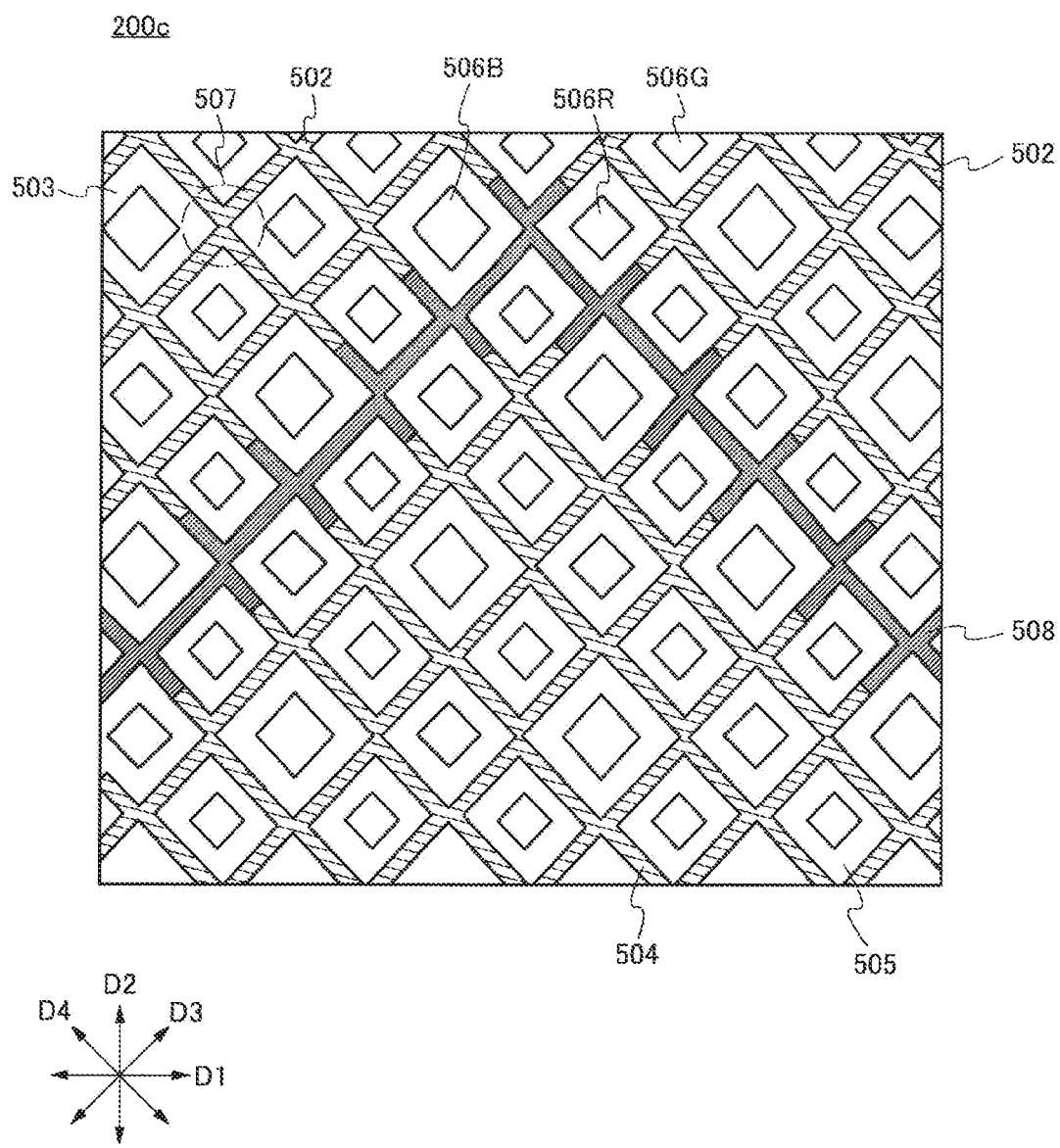
FIG. 14 is a plan view showing a structure of a touch sensor in a display device in embodiment 4.

FIG. 14 is a plan view showing the structure of a touch sensor 200c in the display device of the fourth embodiment. The touch sensor 200c of the present embodiment includes a sensor electrode 502 and a sensor electrode 504. Although two sensor electrodes 502 and one sensor electrode 504 are shown in FIG. 14, the touch sensor 200c includes a plurality of sensor electrodes 502 and a plurality of sensor electrodes 504.

The plurality of sensor electrodes 502 are arranged aligned in the first direction (D1 direction). In addition, although not shown in FIG. 14, the plurality of sensor electrodes 504 are arranged aligned in the second direction (D2 direction). At this time, the sensor electrode 502 and the sensor electrode 504 are formed from a plurality of wirings arranged in a third direction (D3 direction) and a fourth direction (D4 direction). That is, for example, the sensor electrode 502 is formed by a plurality of wirings arranged in a lattice shape giving it a mesh shaped appearance in a plan view. Similarly, the sensor electrode 504 is formed by a plurality of wirings arranged in a lattice shape giving it a mesh shaped appearance in a plan view.

In addition, since the sensor electrode 502 is formed by a plurality of wirings arranged in a lattice shape, the sensor electrode 502 includes a plurality of opening parts 503 which are surrounded by the wirings. Similarly, the sensor electrode 504 includes a plurality of opening parts 505 which are surrounded by wirings. At this time, the plurality of openings part 503 and the plurality of opening parts 505 correspond to the positions of the pixels in the display region in a plan view. That is, light which is emitted from a light emitting element included in a pixel is recognized by a user through the plurality of opening parts 503 and the plurality of opening parts 505.

Furthermore, the size of the opening parts 503 in the touch sensor 200c of the present embodiment is different depending on the size of the pixel. For example, in the present embodiment, a pixel 506G corresponding to green is the smallest, and a pixel 506B corresponding to blue is the largest. A pixel 506R corresponding to red has a size between the pixel 506G corresponding to green and the pixel 506B corresponding to blue. At this time, each opening part 503 is arranged so that the distance from a pixel located on the inner side to the wiring is equal. Therefore, as shown in a region 507 in FIG. 14, the wirings which form the sensor electrode 502 are not arranged linearly in the third direction and the fourth direction but are arranged with a partial step difference. This point is also the same with regards to the structure of the sensor electrode 504.

The touch sensor 200c with the structure described above includes a light shielding layer 508 in a gap between the sensor electrode 502 and the sensor electrode 504. In the present embodiment, the light shielding layer 508 is also arranged at a position equidistant from the pixel 506R, the pixel 506G and the pixel 506B. In addition, the end parts of the light shielding layer 508 are arranged to overlap with the end parts of the wirings which form each sensor electrode 502 and sensor electrode 504.

Figure 15:
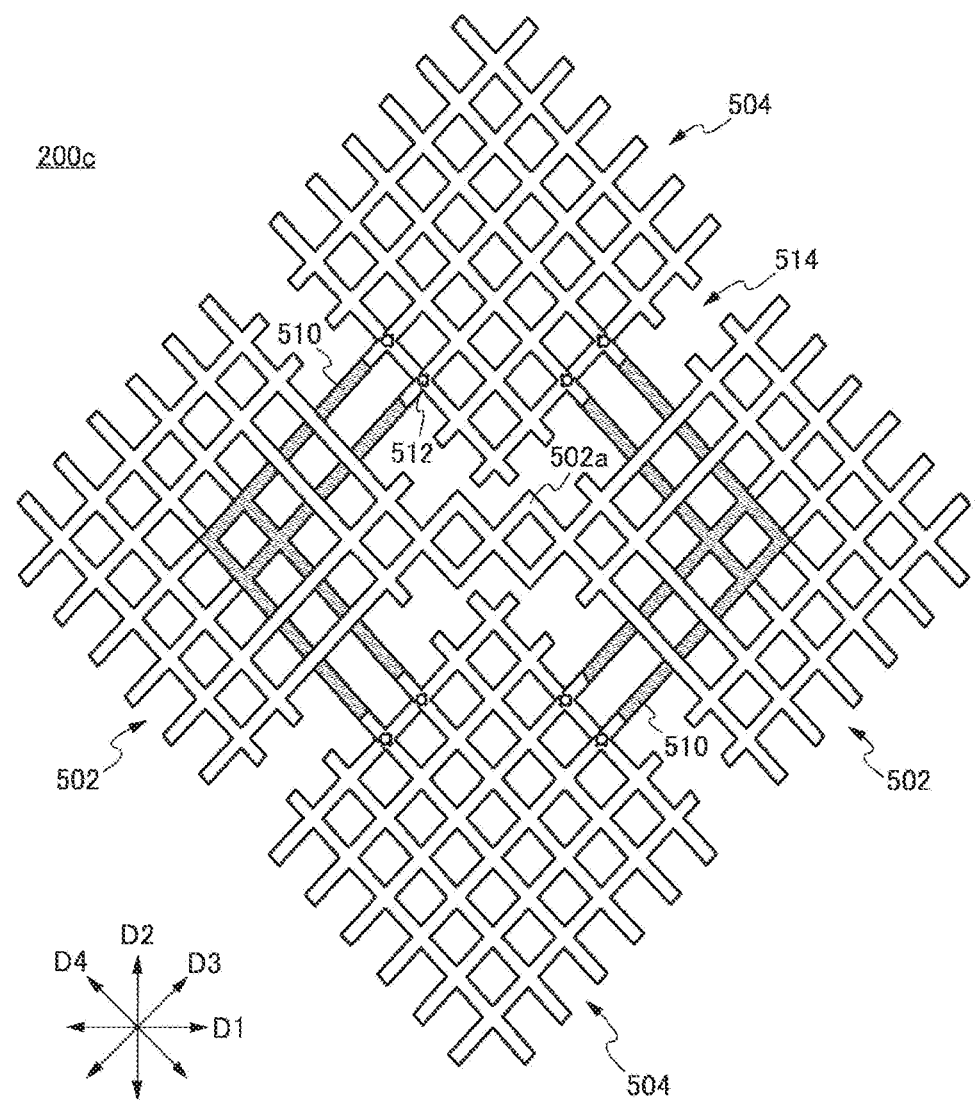
FIG. 15 is a plan view showing a structure of the touch sensor in the display device in embodiment 4.
Figure 16A:
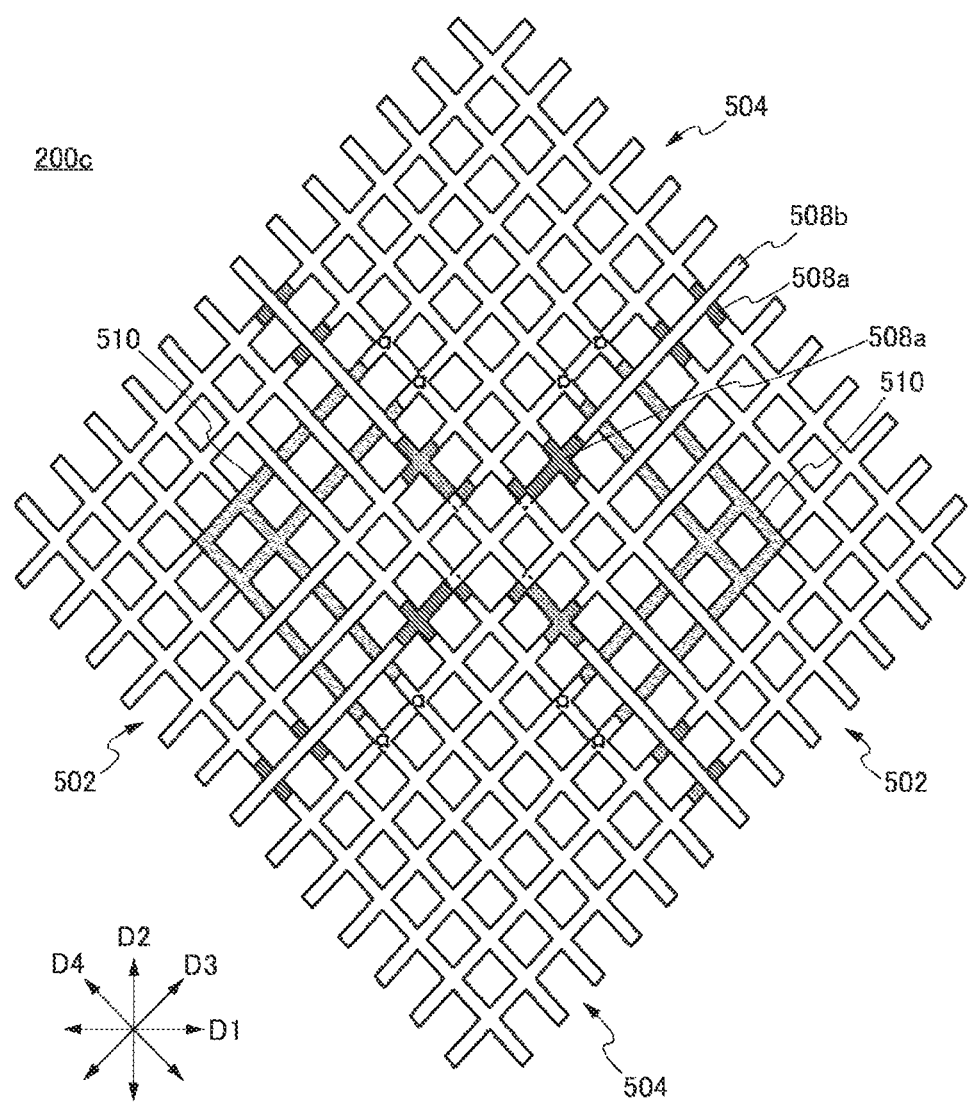
FIG. 16A is a plan view showing a structure of the touch sensor in the display device in embodiment 4.

Here, a more specific structure of the sensor electrode 502 and the sensor electrode 504 in the touch sensor 200c of the present embodiment is explained. FIG. 15 and FIG. 16A are plan views showing the structure of the touch sensor 200c in the display device according to the fourth embodiment. However, FIG. 15 shows a structure in which a depiction of the light shielding layer 508 is omitted from the touch sensor 200c. FIG. 16A shows a structure in which the light shielding layer 508 is included in the touch sensor 200c.

In FIG. 15, a plurality of sensor electrodes 502 are arranged in the first direction (D1 direction) and a plurality of sensor electrodes 504 are arranged in the second direction (D2 direction). Pairs of adjacent sensor electrodes 502 are connected by a connecting part 502a. Similar to the first embodiment, the sensor electrode 502 and the connecting part 502a are continuously connected with the same metal material. Each sensor electrode 504 is electrically connected to the connection wiring 510 via a contact hole 512. In this way, each sensor electrode 504 is electrically connected to each other. In the case of the structure in FIG. 15, since the sensor electrodes 504 are substantially connected by four connection wirings 510, there is high redundancy with respect to disconnection of the connection wiring 510.

In the structure shown in FIG. 15, a gap 514 is formed between the sensor electrode 502 and the sensor electrode 504. The light shielding layer 508 shown in FIG. 14 is arranged in the gap 514. This state is explained using FIG. 16A.

In the structure shown in FIG. 16A, a light shielding layer 508a and a light shielding layer 508b are arranged in the gap 514 shown in FIG. 15. The light shielding layer 508a is a light shielding layer which is arranged in the same layer as the connection wiring 510. The light shielding layer 508b is a light shielding layer which is arranged in the same layer as the sensor electrode 502 and the sensor electrode 504. In the touch sensor 200c of the present embodiment, the light shielding layer 508a and the light shielding layer 508b are combined and fill the gap 514. In this way, it is possible to shield the gap 514 from light while electrically separating the sensor electrode 502 and the sensor electrode 504.

Figure 16B:
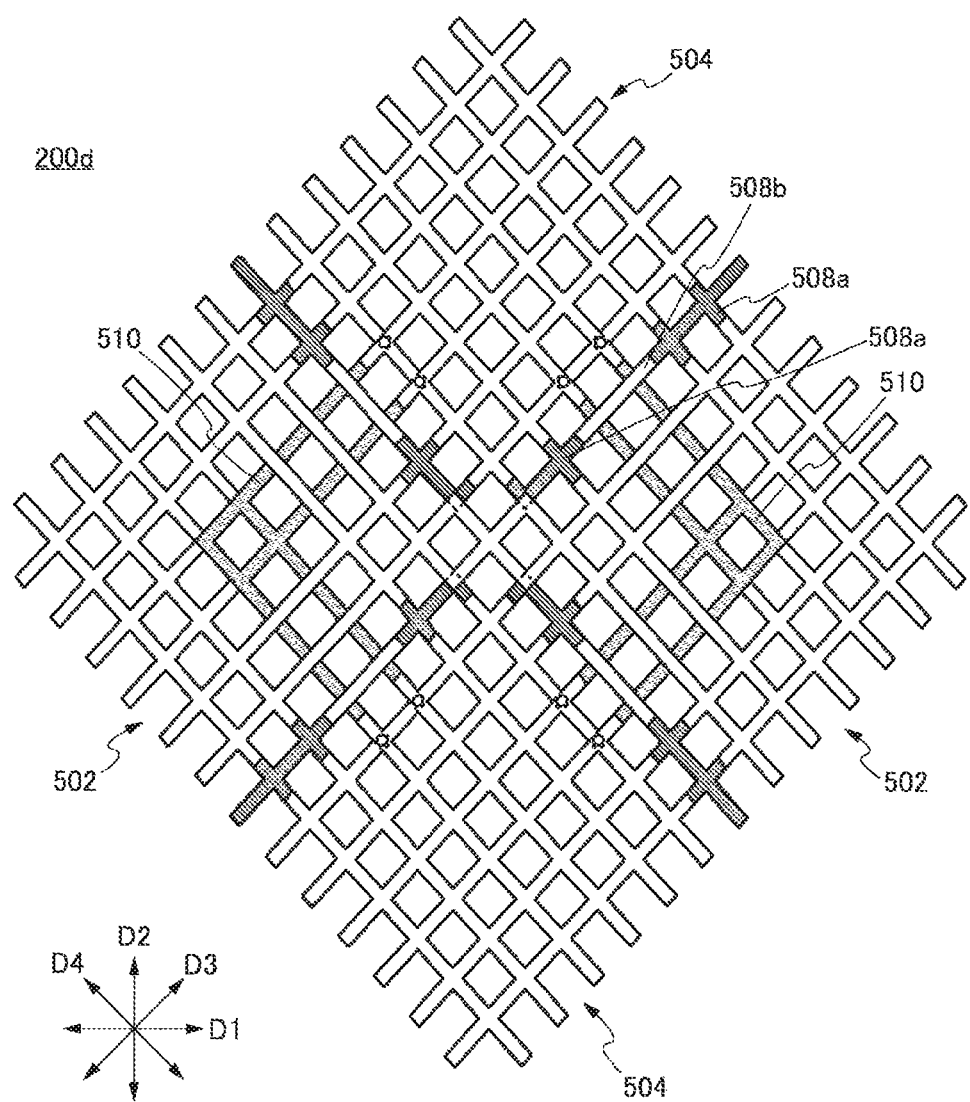
FIG. 16B is a plan view showing a structure of the touch sensor in the display device in embodiment 4.

Furthermore, the structure of the light shielding layer 508a and the light shielding layer 508b is not limited to the structure shown in FIG. 16A. For example, similar to the touch sensor 200d shown in FIG. 16B, the light shielding layer 508b may be arranged only in a region which straddles the connection wiring 510, and the light shielding layer 508a may be arranged in other regions.

Modified Example

FIG. 17 to FIG. 42 are plan views showing a structure of a touch sensor in the display device according to a modified example of the fourth embodiment. However, FIG. 17, 19, 21, 23, 25, 27, 29, 31, 33, 35, 37, 39, and FIG. 41 show structures in which a depiction of the light shielding layer 508 is omitted from the touch sensor 200c. FIG. 18, 20, 22, 24, 26, 28, 30, 32, 34, 36, 38, 40, and FIG. 42 show a structure in which the light shielding layer 508 is included in the touch sensor 200c. Furthermore, reference symbols are attached to parts which are common in FIG. 15 and FIG. 16A and an explanation is omitted.

Figure 17:
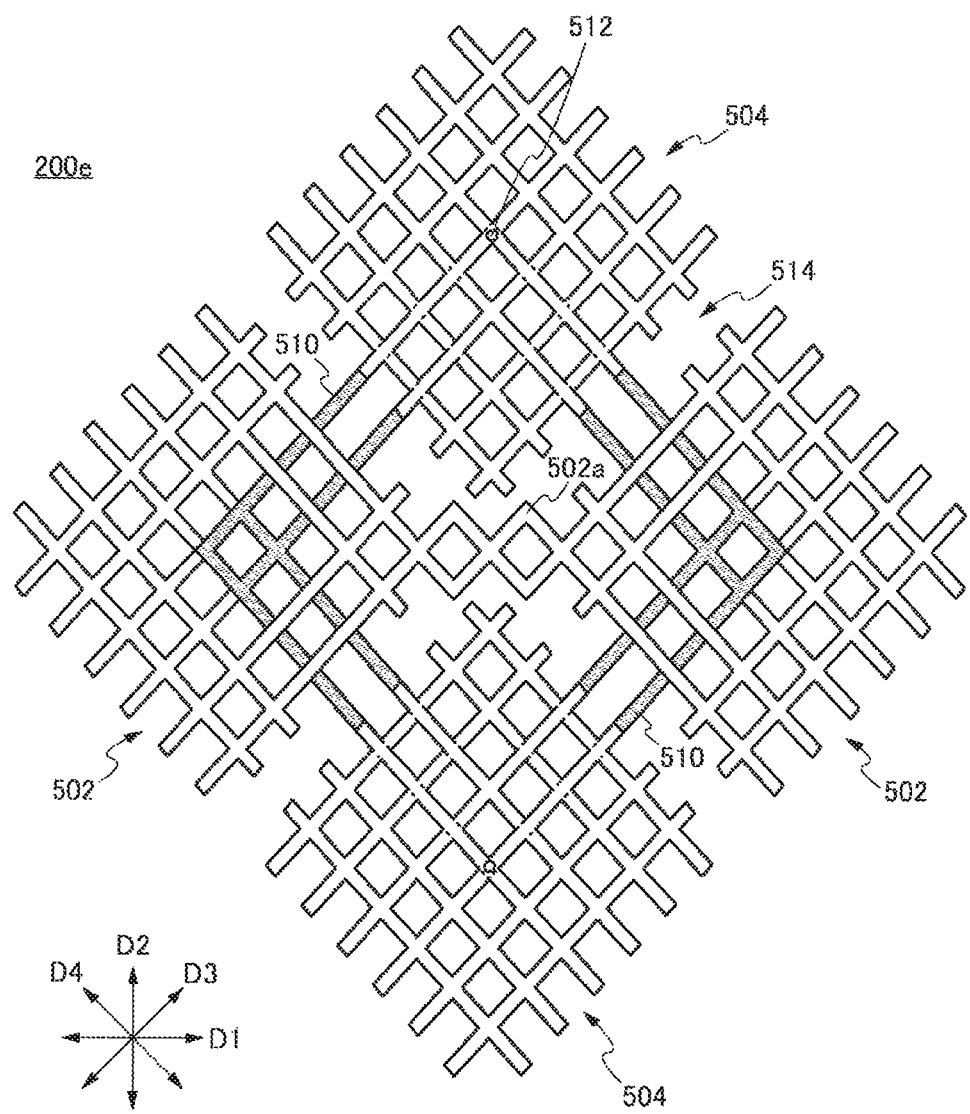
FIG. 17 is a plan view showing a structure of a touch sensor in a display device in modified example of embodiment 4.
Figure 18:
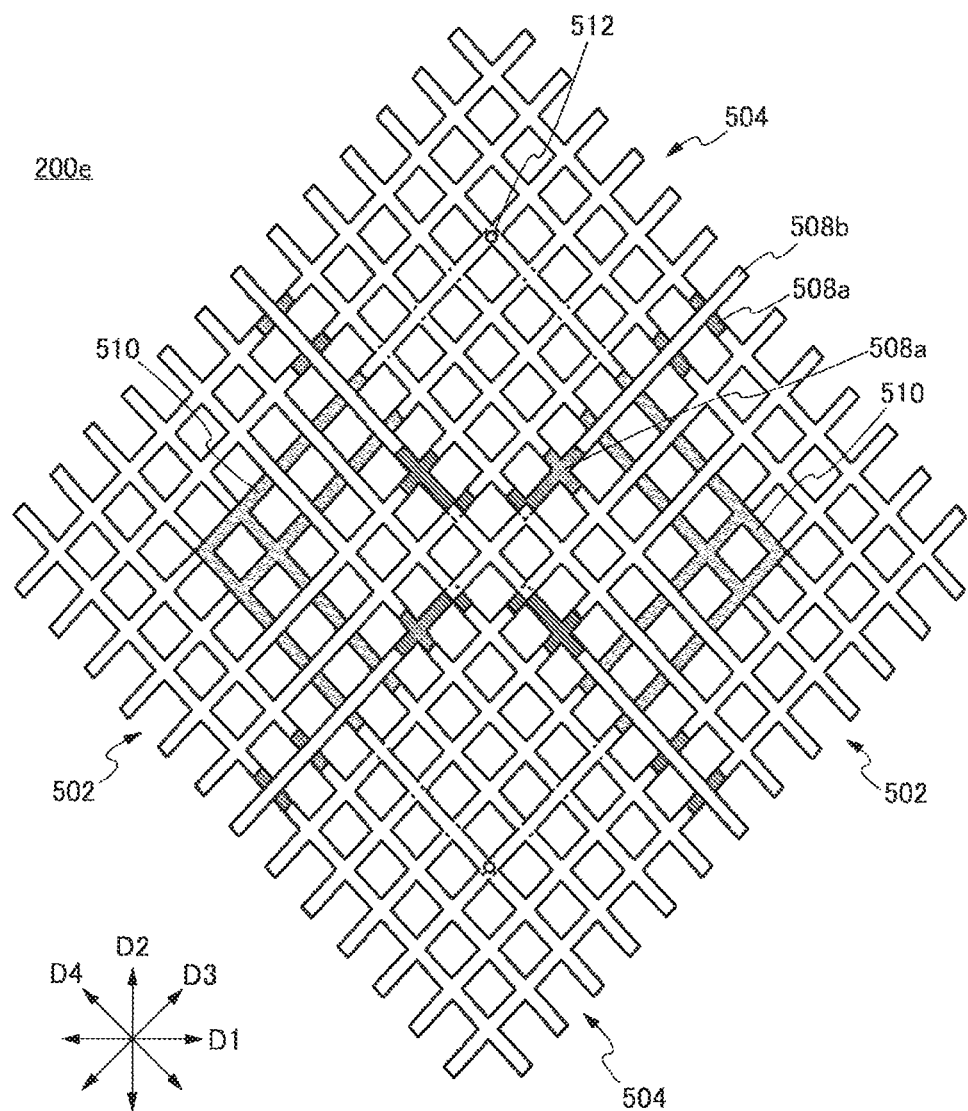
FIG. 18 is a plan view showing a structure of a touch sensor in a display device in modified example of embodiment 4.

FIG. 17 and FIG. 18 are examples of the touch sensor 200e in which two connection wirings 510 shown in FIG. 15 are integrated. In this case, the contact hole 512 may be arranged only in the bent part of the connection wiring 510 as is shown in FIG. 17. FIG. 18 is an example in which a light shielding layer 508a and a light shielding layer 508b are arranged in the gap 514 shown in FIG. 17. As was explained using FIG. 16B, a structure may be adopted in which the light shielding layer 508b may be arranged only in a region which straddles the connection wiring 510 and the light shielding layer 508a may be arranged in other regions. In addition, in the case of the structure in FIG. 17 and FIG. 18, sine the sensor electrode 504 is substantially connected by four connection wirings 510, there is high redundancy with respect to disconnection of the connection wiring 510.

Figure 19:
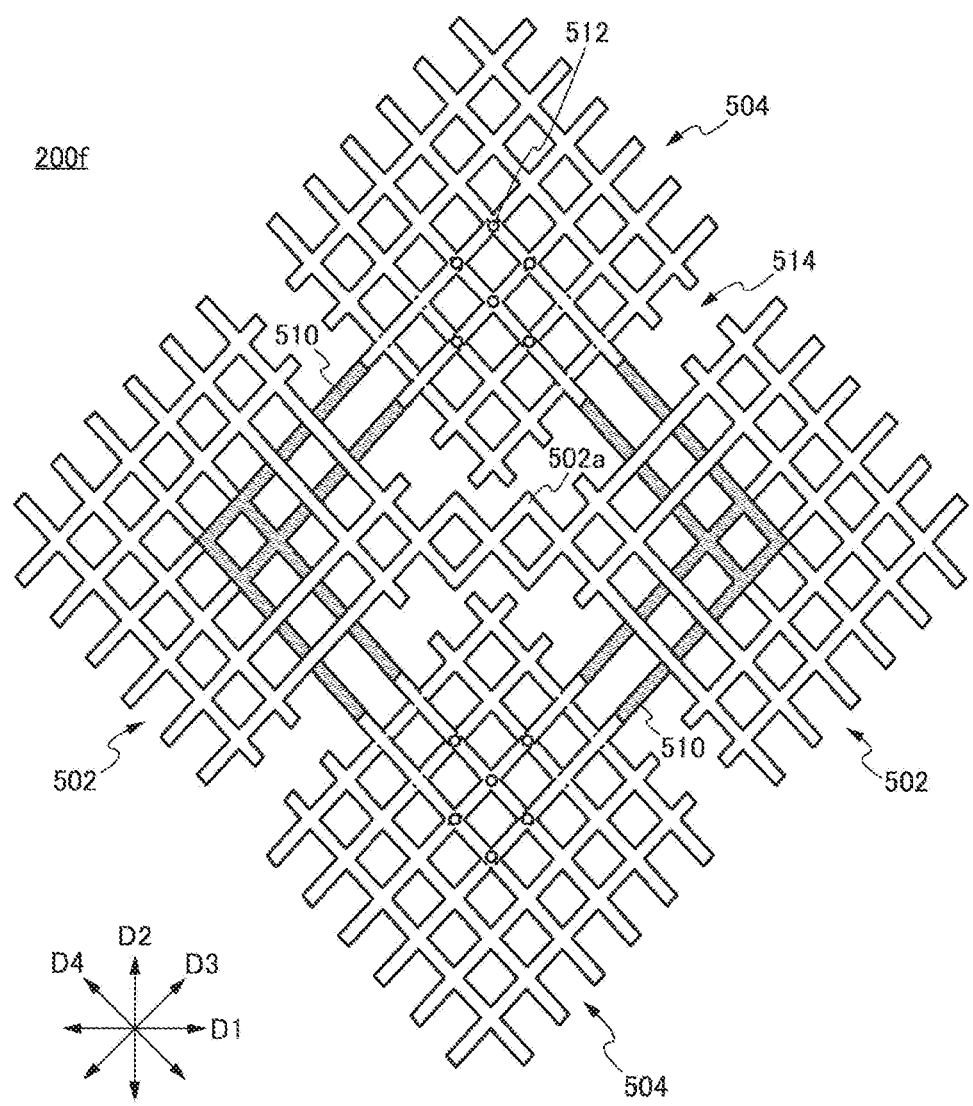
FIG. 19 is a plan view showing a structure of a touch sensor in a display device in modified example of embodiment 4.
Figure 20:
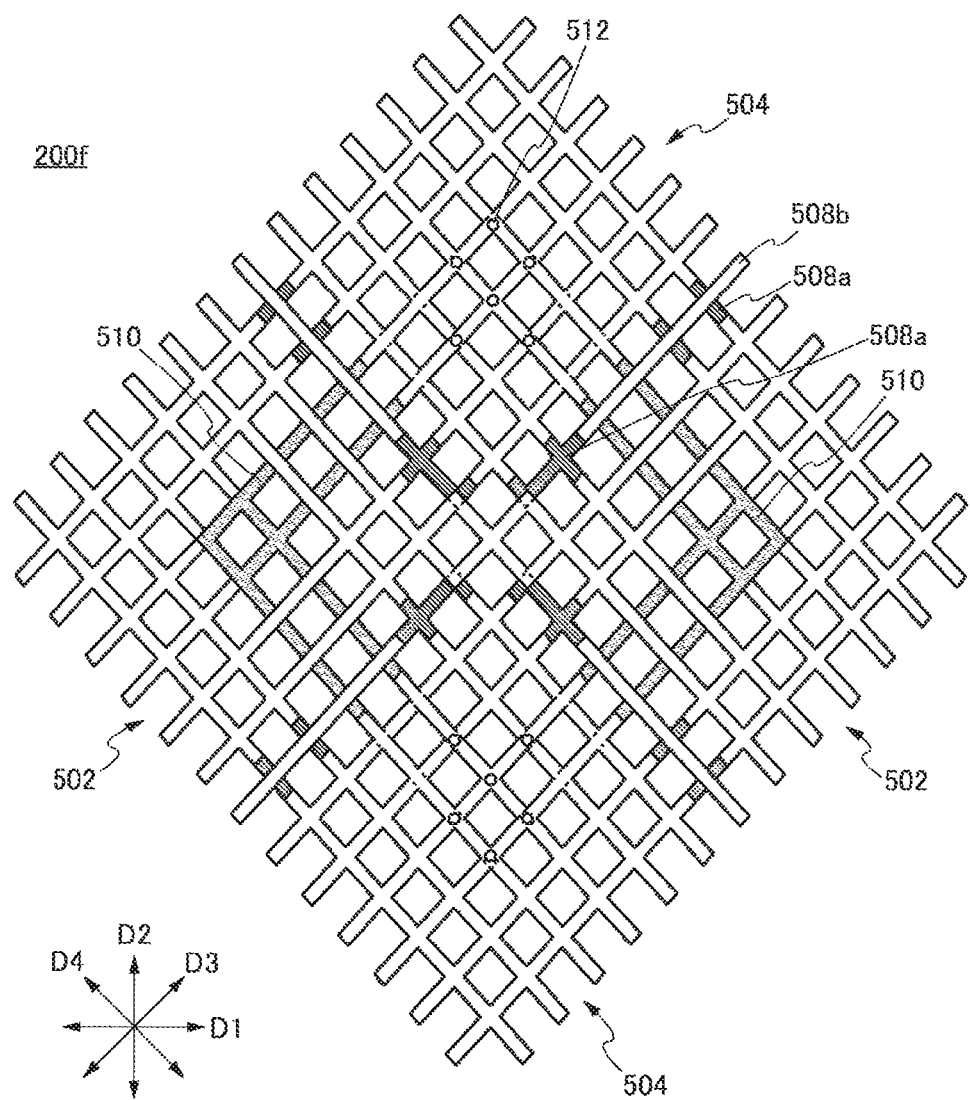
FIG. 20 is a plan view showing a structure of a touch sensor in a display device in modified example of embodiment 4.

FIG. 19 and FIG. 20 are examples of a touch sensor 200f in which the position of a contact hole 512 is increased in the structure shown in FIG. 17. Although FIG. 19 shows an example in which six contact holes 512 are arranged for one sensor electrode 504, the present invention is not limited to this structure and an arbitrary number can be arranged. FIG. 20 is an example in which a light shielding layer 508a and a light shielding layer 508b are arranged in the gap 514 shown in FIG. 19. As was explained using FIG. 16B, the light shielding layer 508b may be arranged only in a region which straddles the connection wiring 510, and the light shielding layer 508a may be arranged in other regions. In addition, in the case of the structure in FIG. 19 and FIG. 20, since the sensor electrode 504 is substantially connected by four connection wirings 510 and includes a plurality of contact holes 512, there is high redundancy with respect to disconnection of the connection wiring 510.

Figure 21:
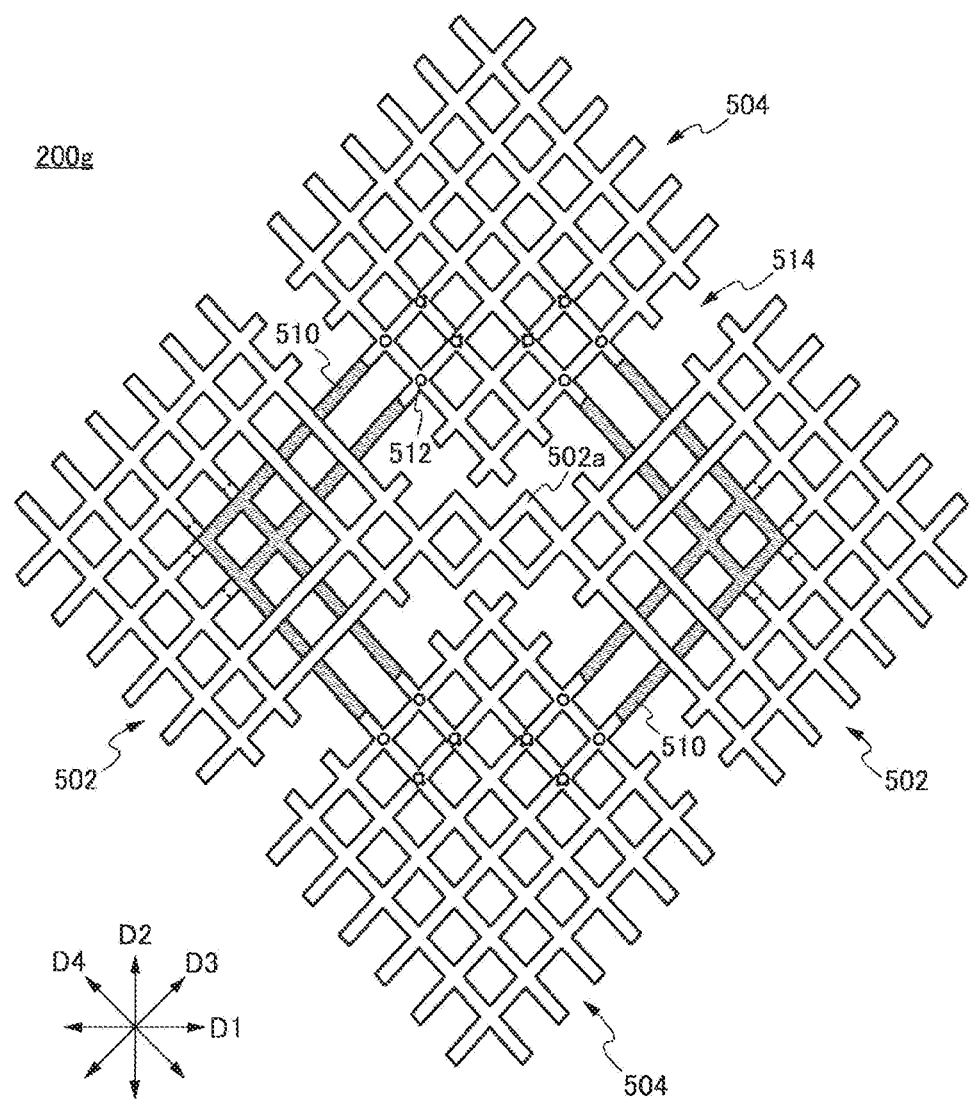
FIG. 21 is a plan view showing a structure of a touch sensor in a display device in modified example of embodiment 4.
Figure 22:
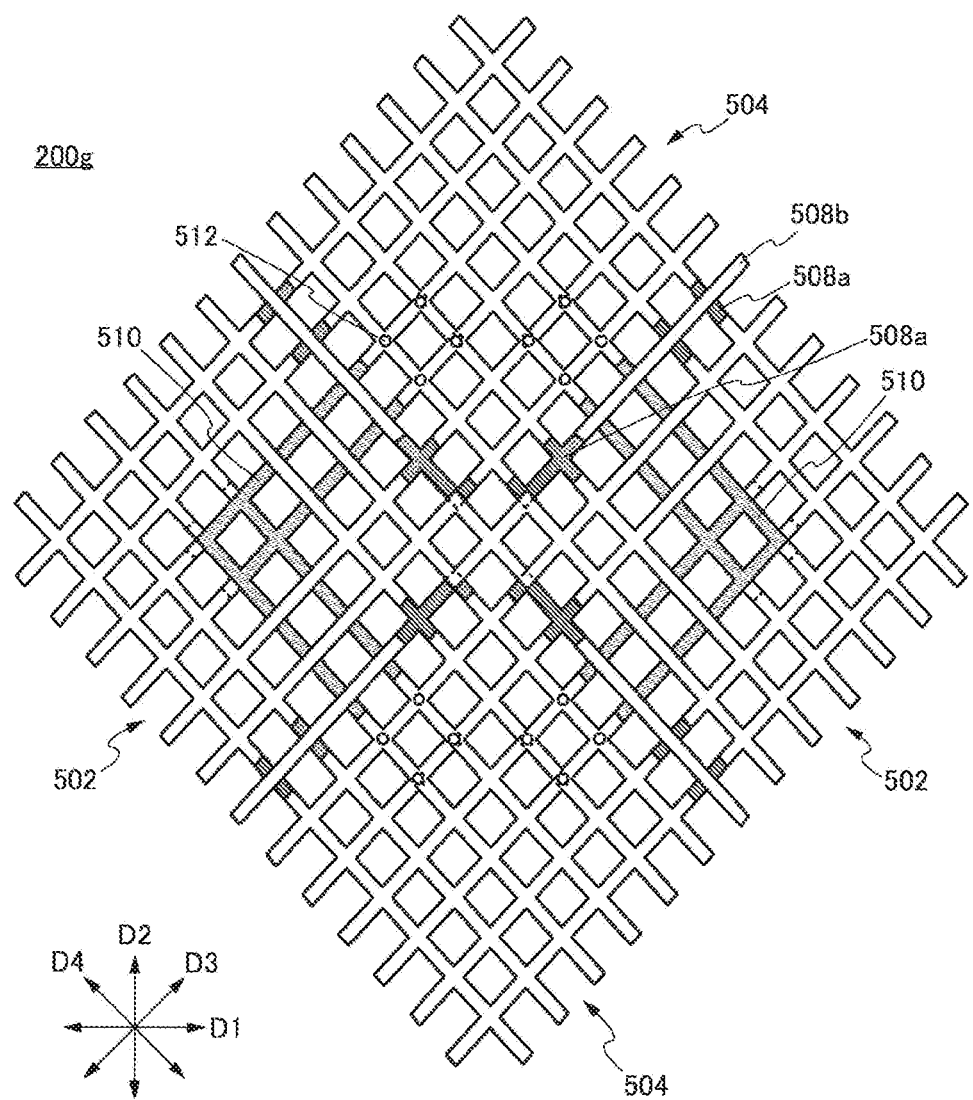
FIG. 22 is a plan view showing a structure of a touch sensor in a display device in modified example of embodiment 4.

FIG. 21 and FIG. 22 are examples of a touch sensor 200g in which the position of the contact hole 512 is increased in the structure shown in FIG. 15. Although FIG. 21 shows an example in which eight contact holes 512 are arranged for one sensor electrode 504, the present invention is not limited to this structure, and an arbitrary number can be arranged. FIG. 22 is an example in which a light shielding layer 508a and a light shielding layer 508b are arranged in the gap 514 shown in FIG. 21. As was explained using FIG. 16B, the light shielding layer 508b may be arranged only in a region which straddles the connection wiring 510, and the light shielding layer 508a may be arranged in other regions. In addition, in the case of the structure shown in FIG. 21 and FIG. 22, since the sensor electrode 504 is substantially connected by the four connection wirings 510 and has a plurality of contact holes 512, there is high redundancy with respect to disconnection of the connection wiring 510.

Figure 23:
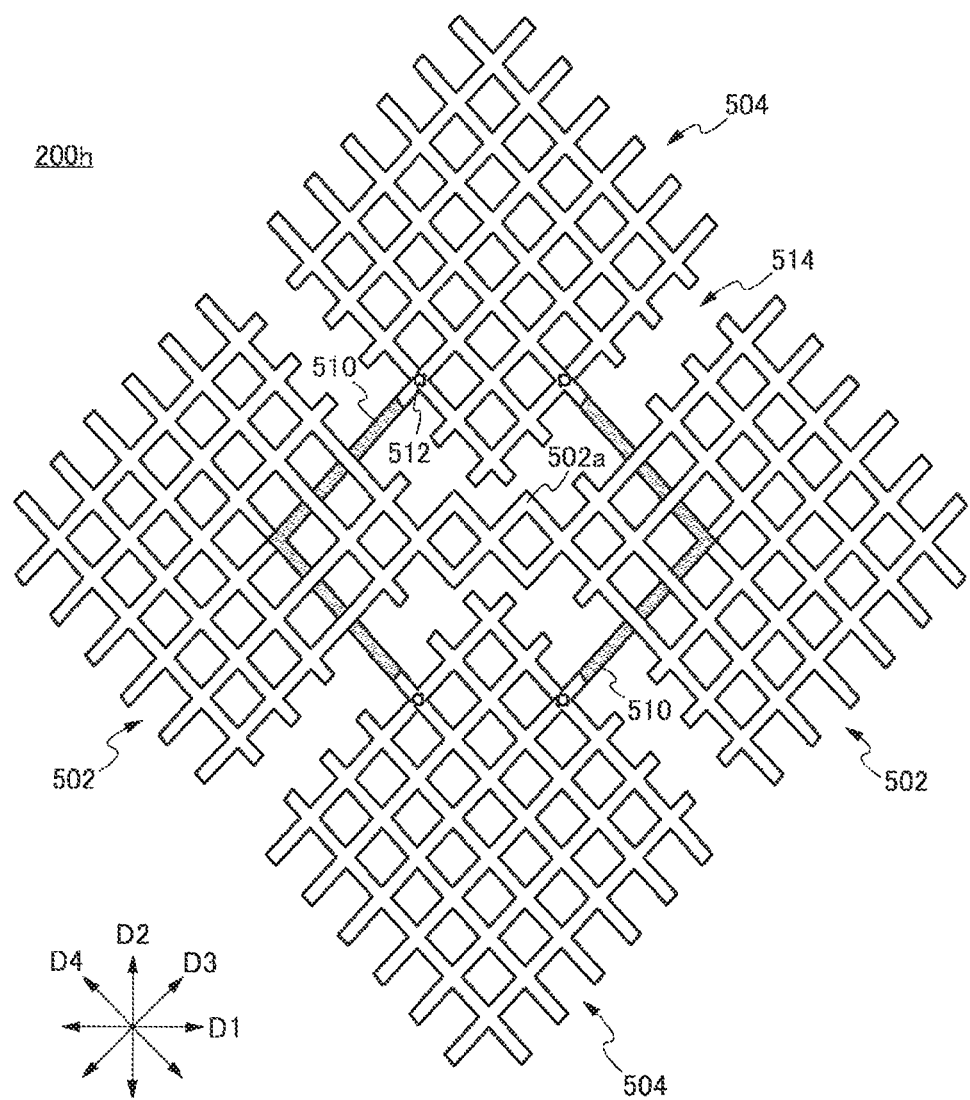
FIG. 23 is a plan view showing a structure of a touch sensor in a display device in modified example of embodiment 4.
Figure 24:
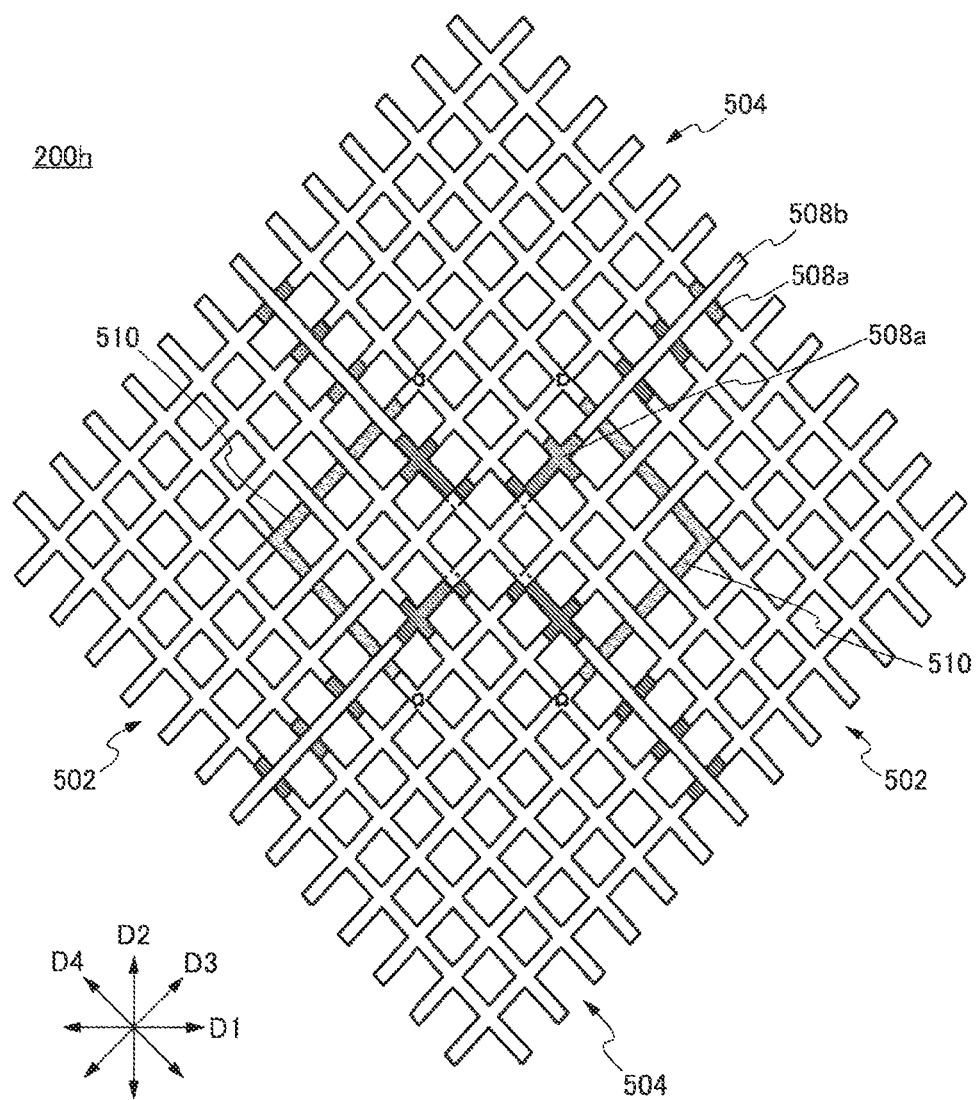
FIG. 24 is a plan view showing a structure of a touch sensor in a display device in modified example of embodiment 4.

FIG. 23 and FIG. 24 are examples of a touch sensor 200h in which the connection wiring 510 which is formed by combining two wirings shown in FIG. 15 is formed into one wiring. FIG. 24 shows an example in which a light shielding layer 508a and a light shielding layer 508b are arranged in the gap 514 shown in FIG. 23. As was explained using FIG. 16B, the light shielding layer 508b may be arranged only in a region which straddles the connection wiring 510, and the light shielding layer 508a may be arranged in other regions.

Figure 25:
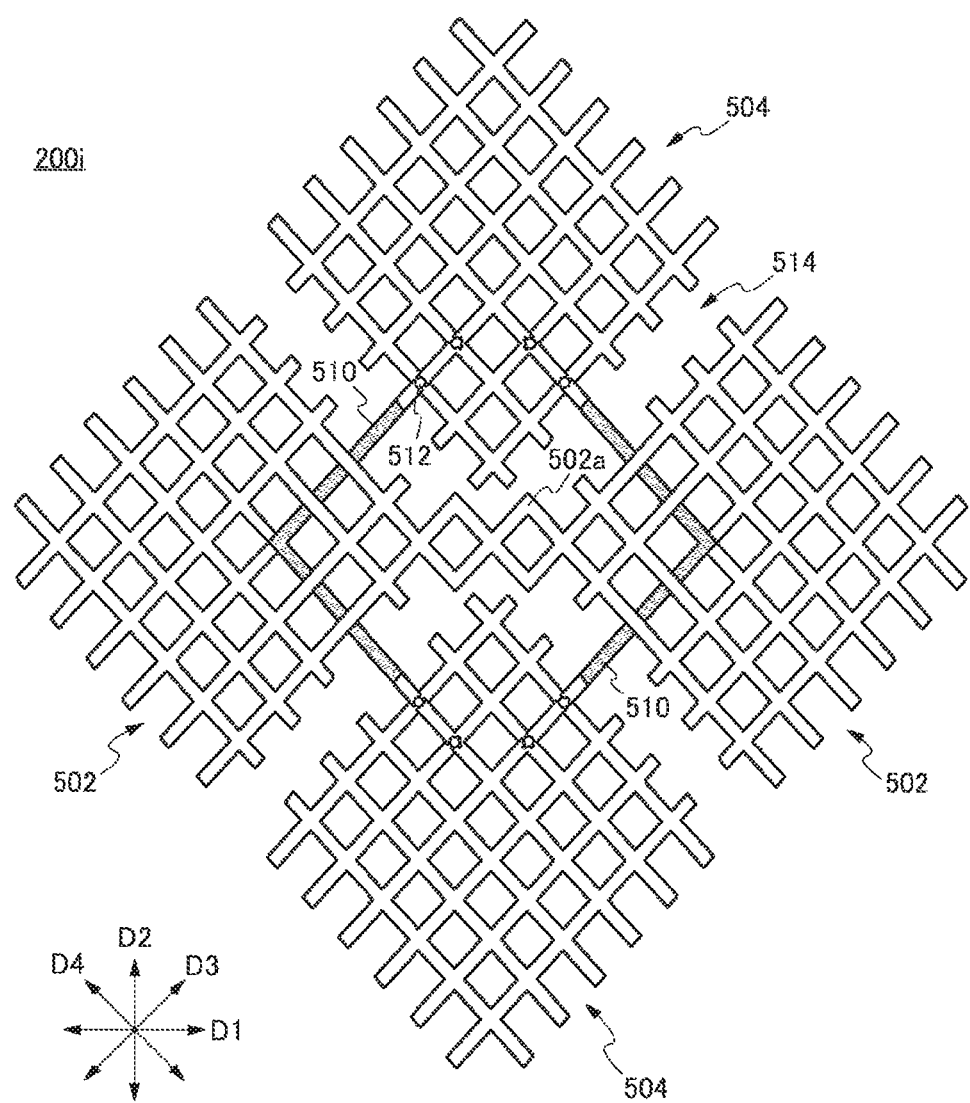
FIG. 25 is a plan view showing a structure of a touch sensor in a display device in modified example of embodiment 4.
Figure 26:
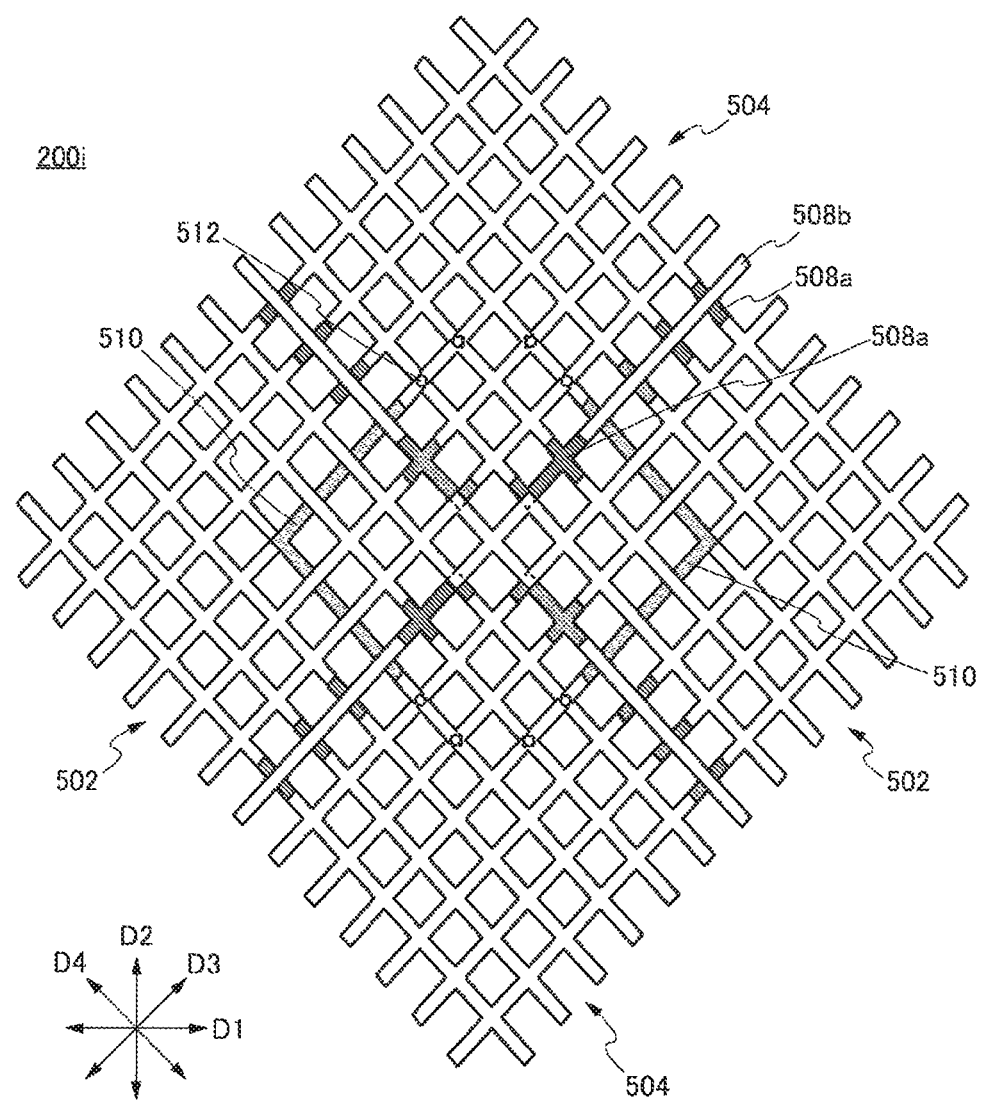
FIG. 26 is a plan view showing a structure of a touch sensor in a display device in modified example of embodiment 4.

FIG. 25 and FIG. 26 are examples of a touch sensor 200i in which the position of the contact hole 512 is increased in the structure shown in FIG. 23. Although FIG. 25 shows an example in which four contact holes 512 are arranged for one sensor electrode 504, the present invention is not limited to this structure and an arbitrary number can be arranged. FIG. 26 is an example in which the light shielding layer 508a and the light shielding layer 508b are arranged in the gap 514 shown in FIG. 25. As was explained using FIG. 16B, the light shielding layer 508b may be arranged only in a region which straddles the connection wiring 510 and the light shielding layer 508a may be arranged in other regions.

Figure 27:
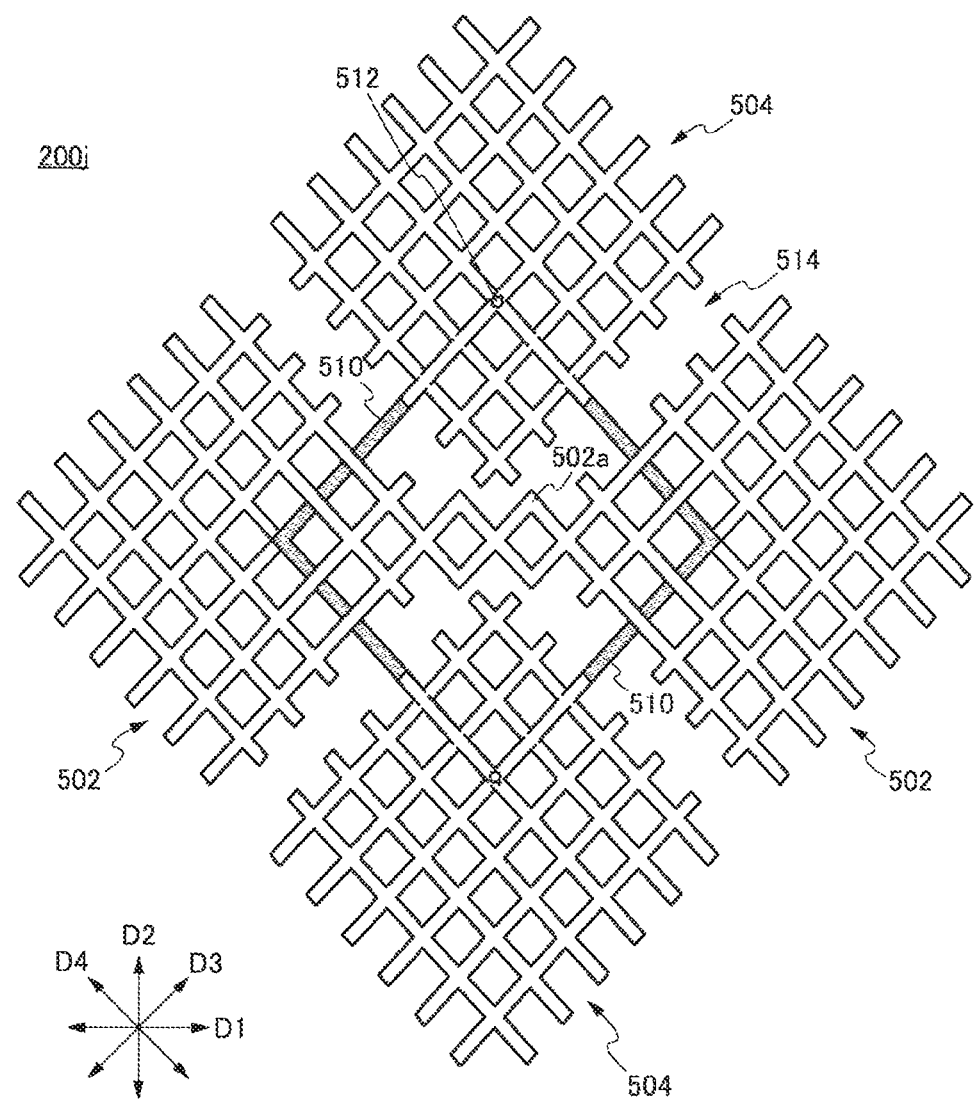
FIG. 27 is a plan view showing a structure of a touch sensor in a display device in modified example of embodiment 4.
Figure 28:
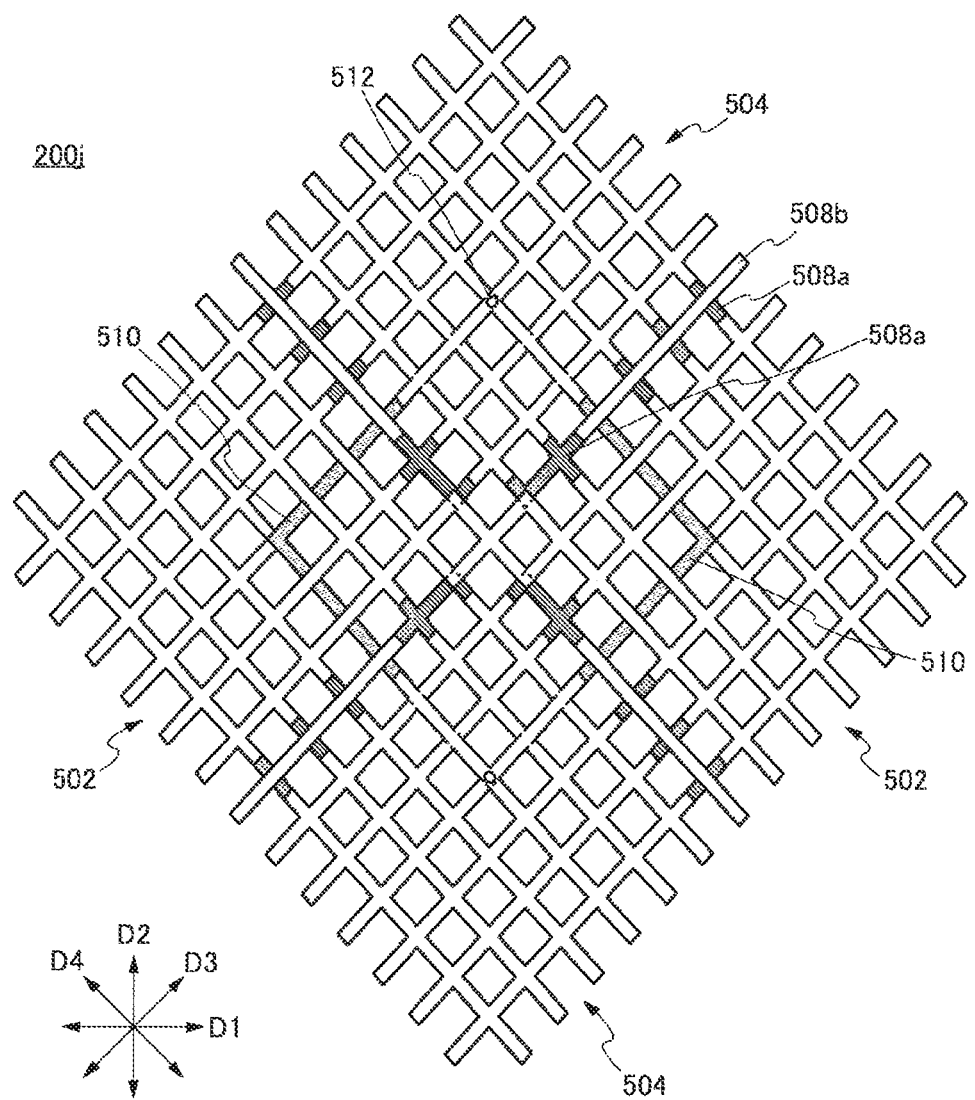
FIG. 28 is a plan view showing a structure of a touch sensor in a display device in modified example of embodiment 4.

FIG. 27 and FIG. 28 show an example of a touch sensor 200j in which two connection wirings 510 shown in FIG. 23 are integrated. In this case, the contact hole 512 may be arranged only in the bent part of the connection wiring 510 as is shown in FIG. 27. FIG. 28 shows an example in which a light shielding layer 508a and a light shielding layer 508b are arranged in the gap 514 shown in FIG. 27. As was explained using FIG. 16B, the light shielding layer 508b may be arranged only in a region which straddles the connection wiring 510 and the light shielding layer 508a may be arranged in other regions.

Figure 29:
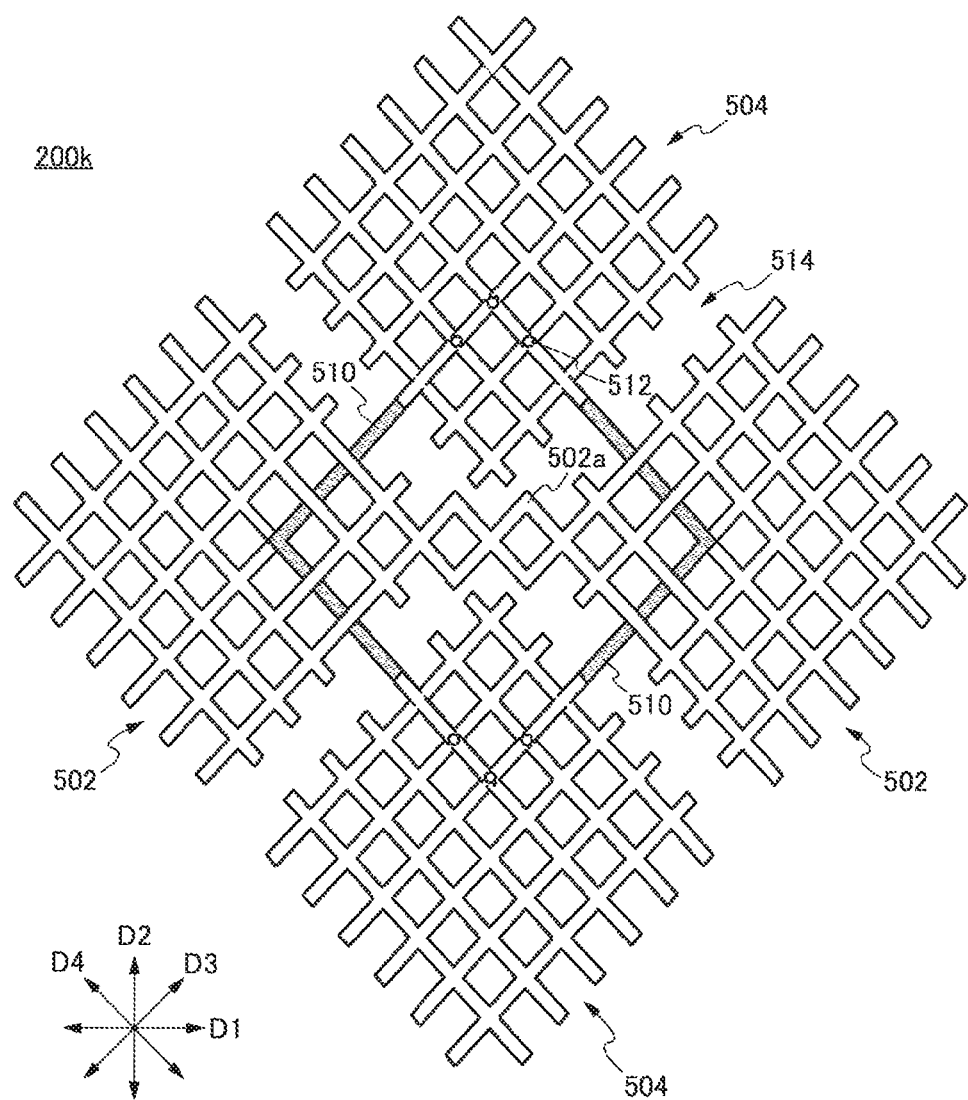
FIG. 29 is a plan view showing a structure of a touch sensor in a display device in modified example of embodiment 4.
Figure 30:
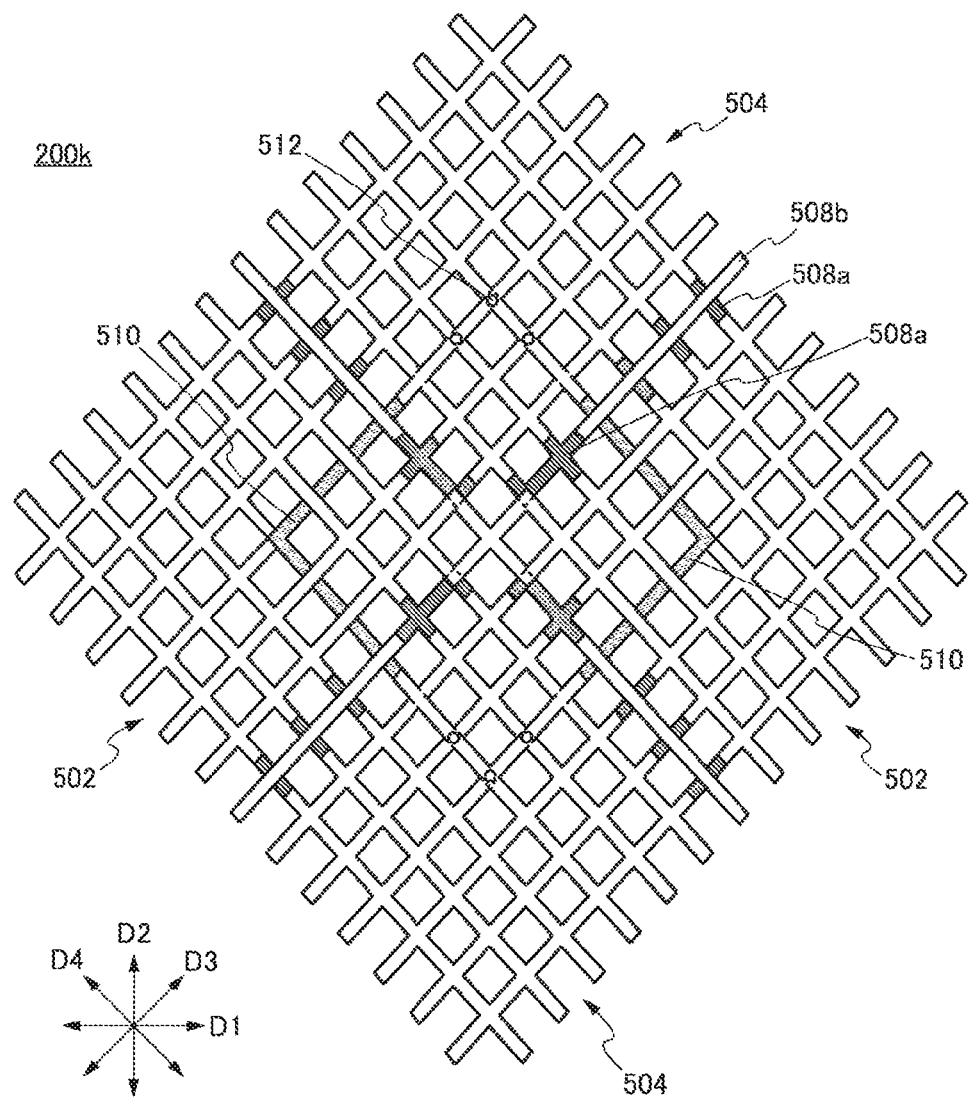
FIG. 30 is a plan view showing a structure of a touch sensor in a display device in modified example of embodiment 4.
Figure 31:
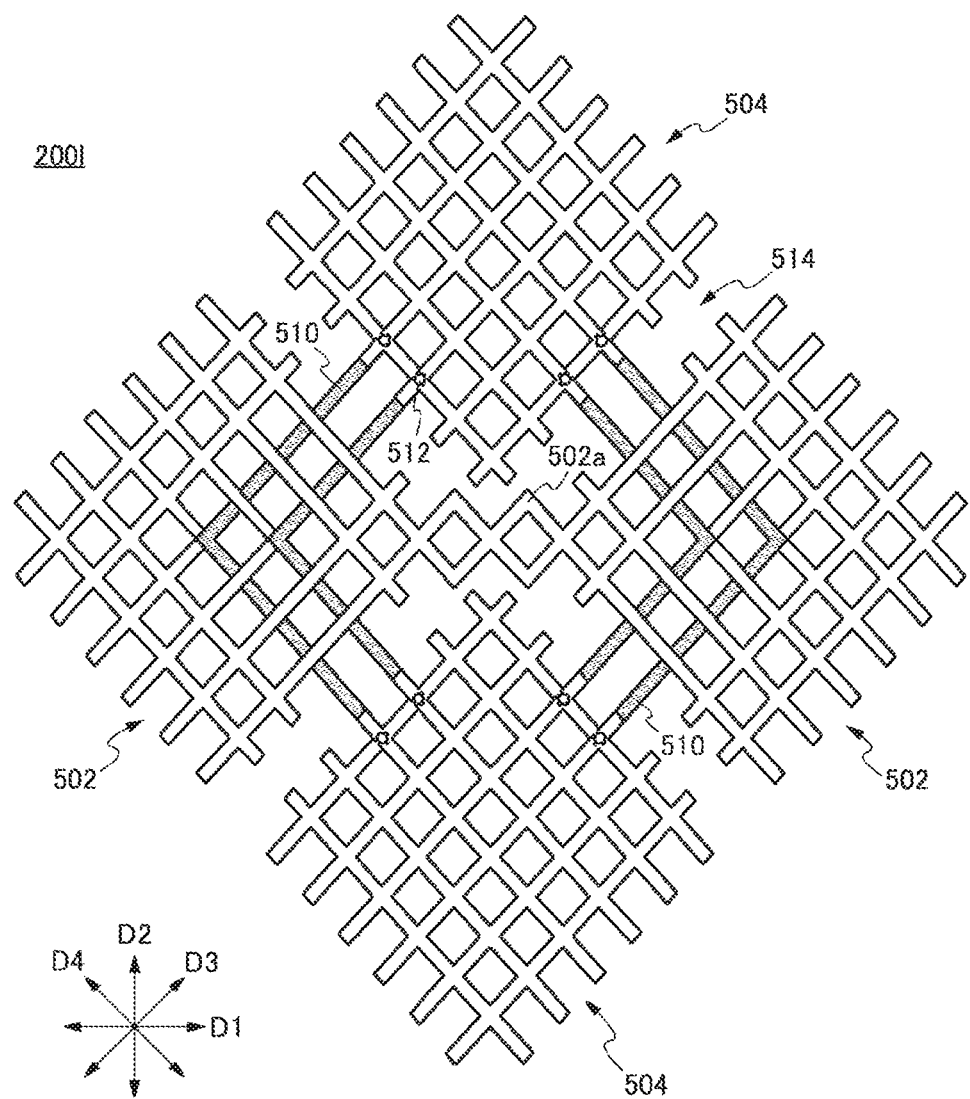
FIG. 31 is a plan view showing a structure of a touch sensor in a display device in modified example of embodiment 4.
Figure 32:
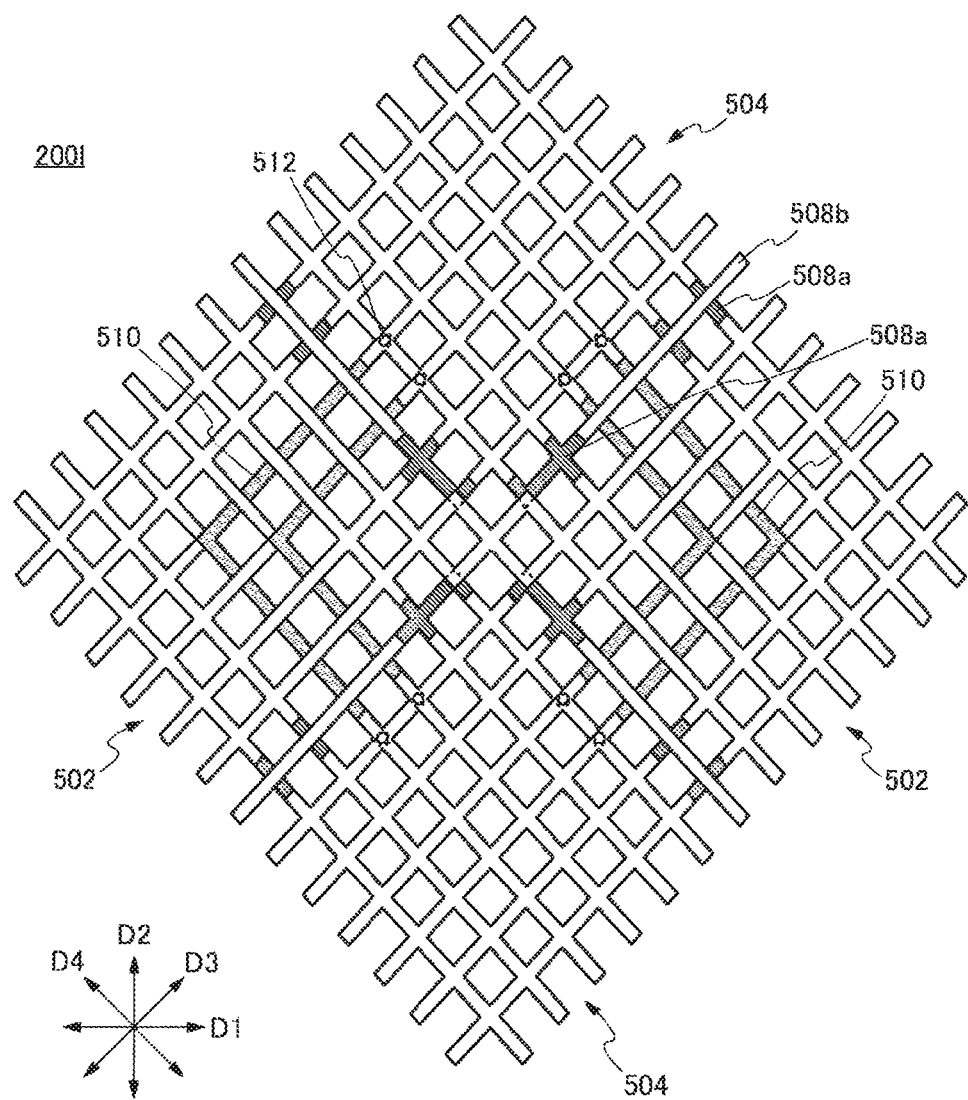
FIG. 32 is a plan view showing a structure of a touch sensor in a display device in modified example of embodiment 4.

FIG. 29 and FIG. 30 are examples of a touch sensor 200k in which the position of the contact hole 512 is increased in the structure shown in FIG. 27. Although FIG. 29 shows an example in which three contact holes 512 are arranged for one sensor electrode 504, the present invention is not limited to this structure and an arbitrary number can be arranged. FIG. 30 is an example in which a light shielding layer 508a and a light shielding layer 508b are arranged in the gap 514 shown in FIG. 29. As was explained using FIG. 16B, the light shielding layer 508b may be arranged only in a region which straddles the connection wiring 510, and the light shielding layer 508a may be arranged in other regions FIG. 31 and FIG. 32 are examples of a touch sensor 200l arranged with respect to two connection wirings 510 shown in FIG. 23. FIG. 32 is an example in which a light shielding layer 508a and a light shielding layer 508b are arranged in the gap 514 shown in FIG. 31. As was explained using FIG. 16B, the light shielding layer 508b may be arranged only in a region which straddles the connection wiring 510, and the light shielding layer 508a may be arranged in other regions. In addition, in the case of the structure in FIG. 31, since the sensor electrode 504 is connected by four connection wirings 510, there is high redundancy with respect to disconnection of the connection wiring 510.

Figure 33:
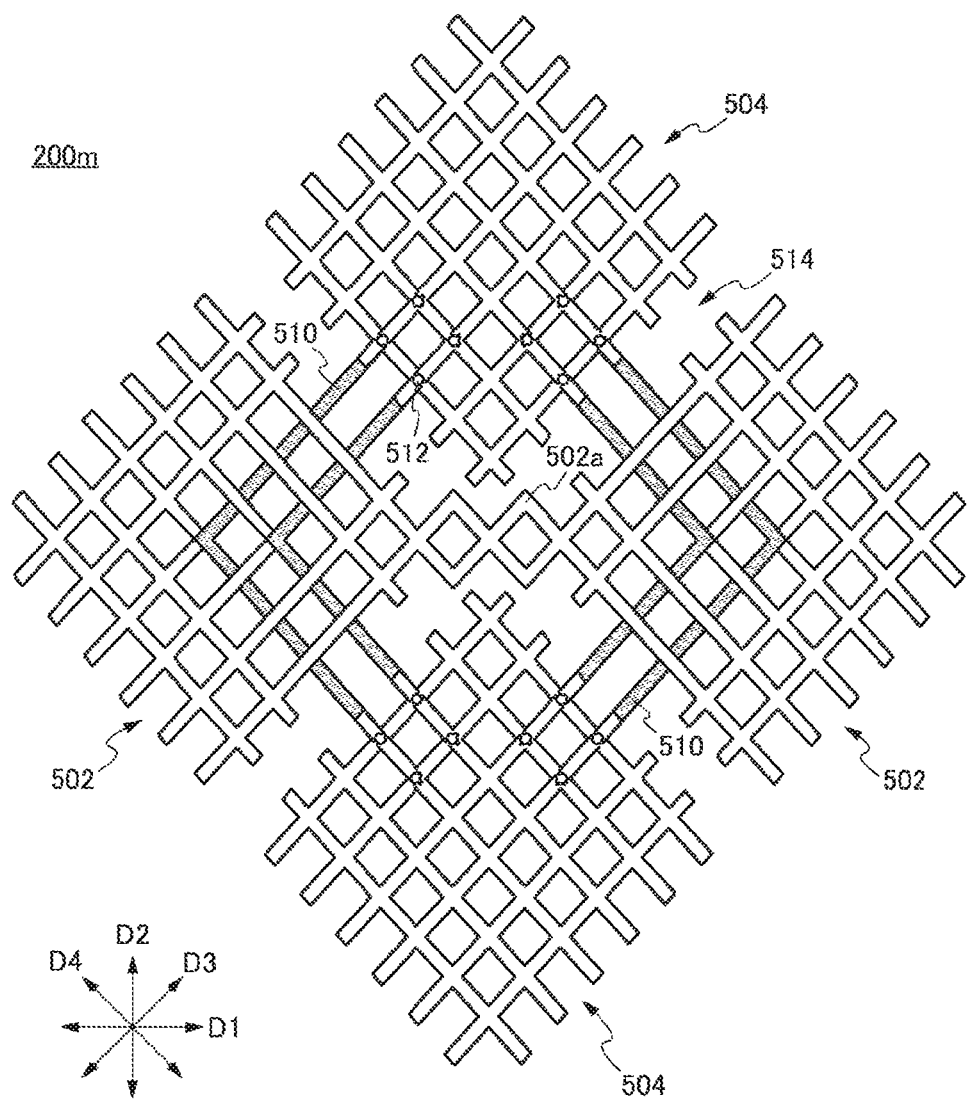
FIG. 33 is a plan view showing a structure of a touch sensor in a display device in modified example of embodiment 4.
Figure 34:
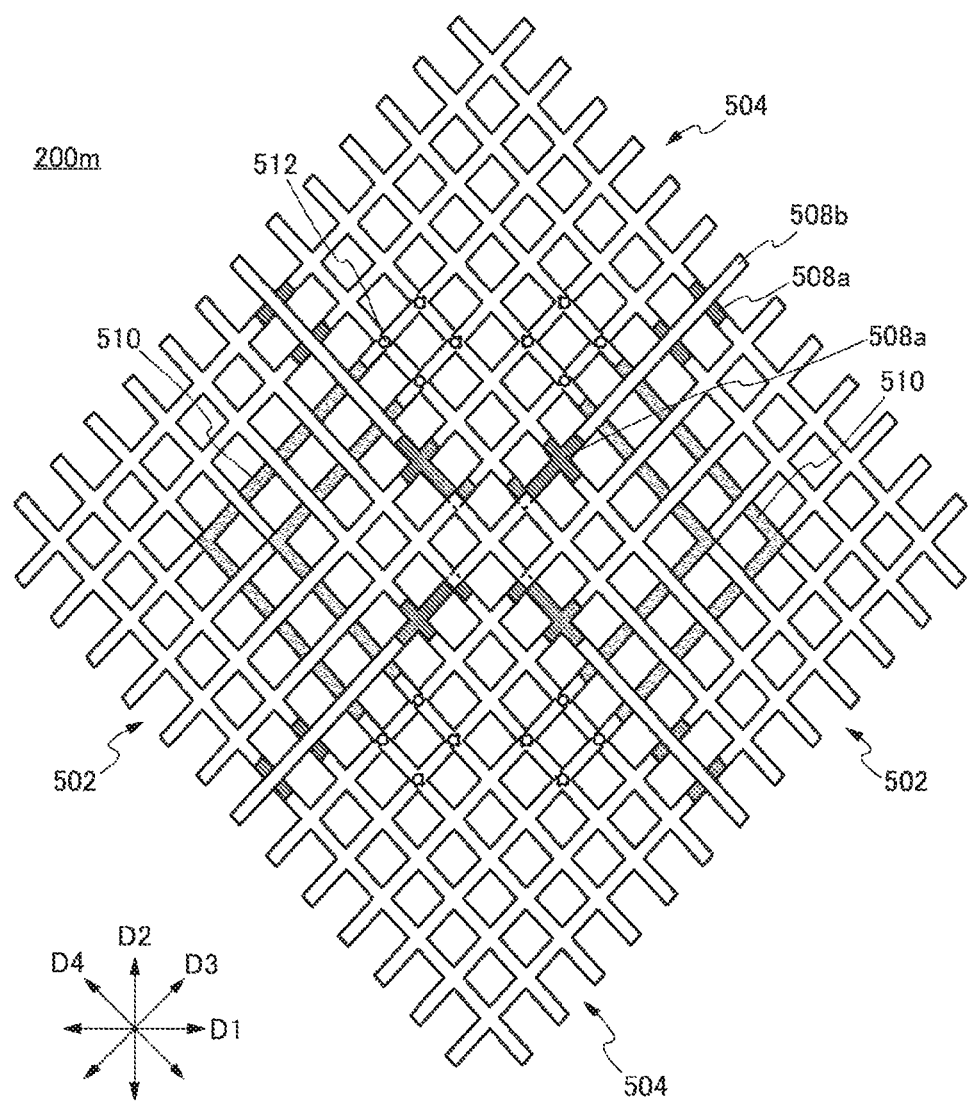
FIG. 34 is a plan view showing a structure of a touch sensor in a display device in modified example of embodiment 4.

FIG. 33 and FIG. 34 are examples of a touch sensor 200m in which the position of the contact hole 512 is increased in the structure shown in FIG. 31. Although FIG. 33 shows an example in which eight contact holes 512 are arranged for one sensor electrode 504, the present invention is not limited to this structure and an arbitrary number can be arranged. FIG. 34 is an example in which a light shielding layer 508a and a light shielding layer 508b are arranged in the gap 514 shown in FIG. 33. As was explained using FIG. 16B, the light shielding layer 508b may be arranged only in a region which straddles the connection wiring 510, and the light shielding layer 508a may be arranged in other regions. In addition, in the case of the structure in FIG. 33 and FIG. 34, since the sensor electrode 504 is substantially connected by four connection wirings 510 and has a plurality of contact holes 512, there is high redundancy with respect to disconnection of the connection wiring 510.

Figure 35:
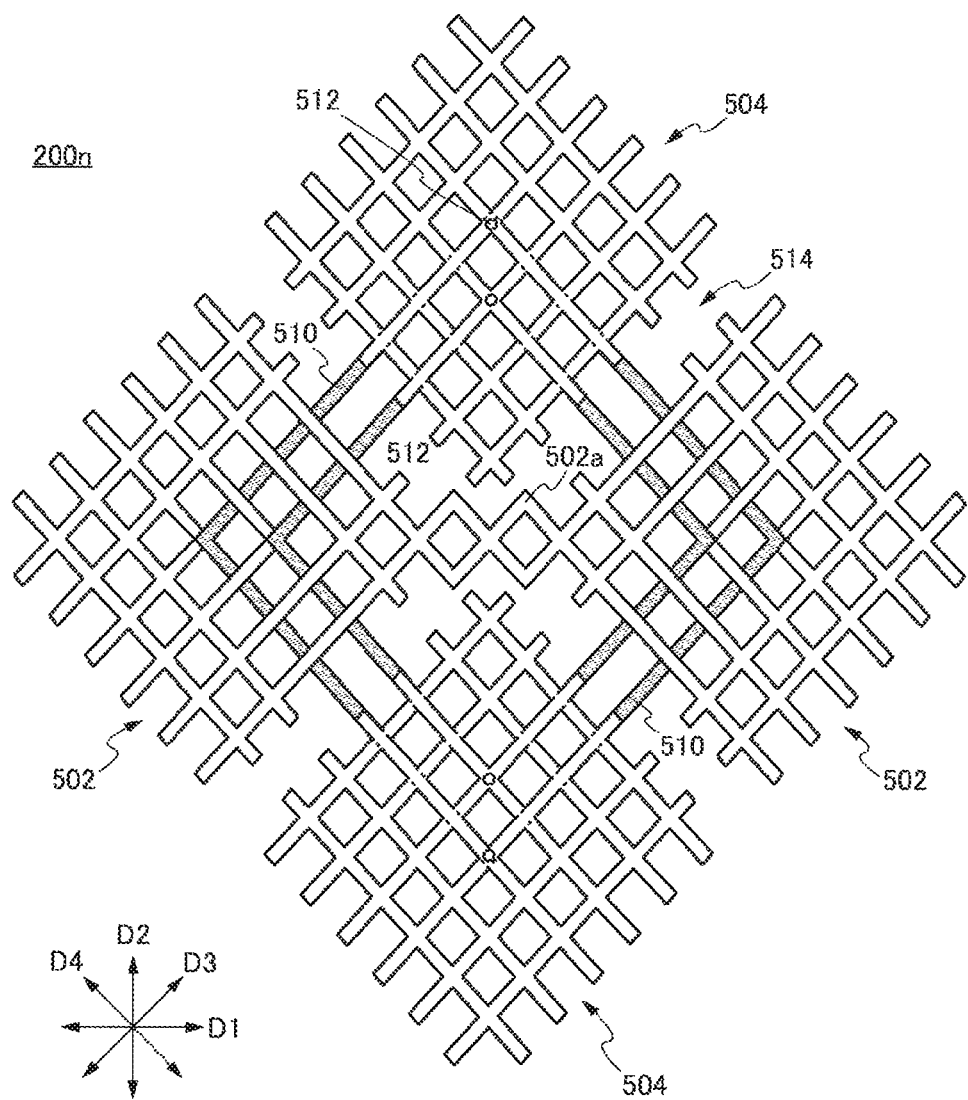
FIG. 35 is a plan view showing a structure of a touch sensor in a display device in modified example of embodiment 4.
Figure 36:
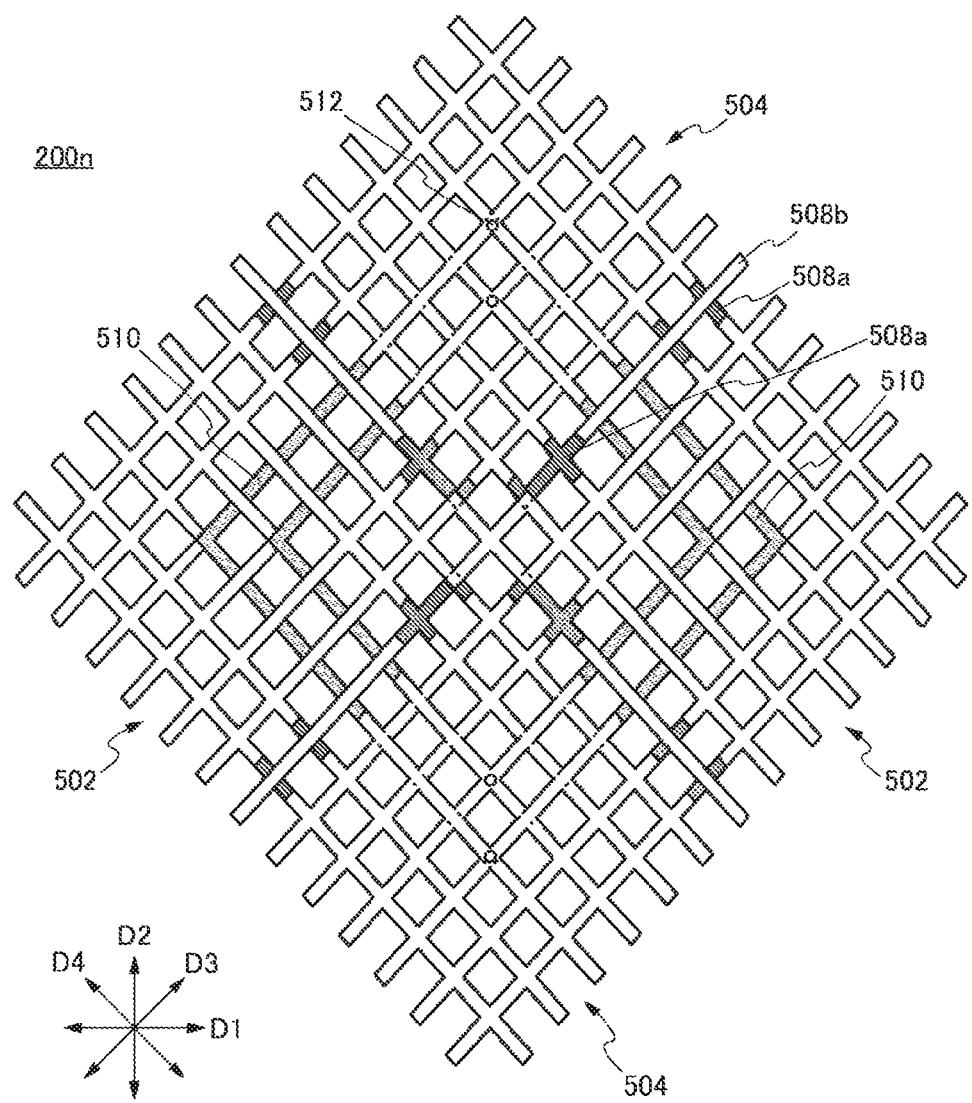
FIG. 36 is a plan view showing a structure of a touch sensor in a display device in modified example of embodiment 4.

FIG. 35 and FIG. 36 are examples of a touch sensor 200n in which the two connection wirings 510 shown in FIG. 31 are integrated. In this case, the contact hole 512 may be arranged only in the bent part of the connection wiring 510. FIG. 36 is an example in which a light shielding layer 508a and a light shielding layer 508b are arranged in the gap 514 shown in FIG. 35. As was explained using FIG. 16B, the light shielding layer 508b may be arranged only in a region which straddles the connection wiring 510, and the light shielding layer 508a may be arranged in other regions. In addition, in the case of the structure in FIG. 35 and FIG. 36, since the sensor electrode 504 is substantially connected by four connection wirings 510, there is high redundancy with respect to disconnection of the connection wiring 510.

Figure 37:
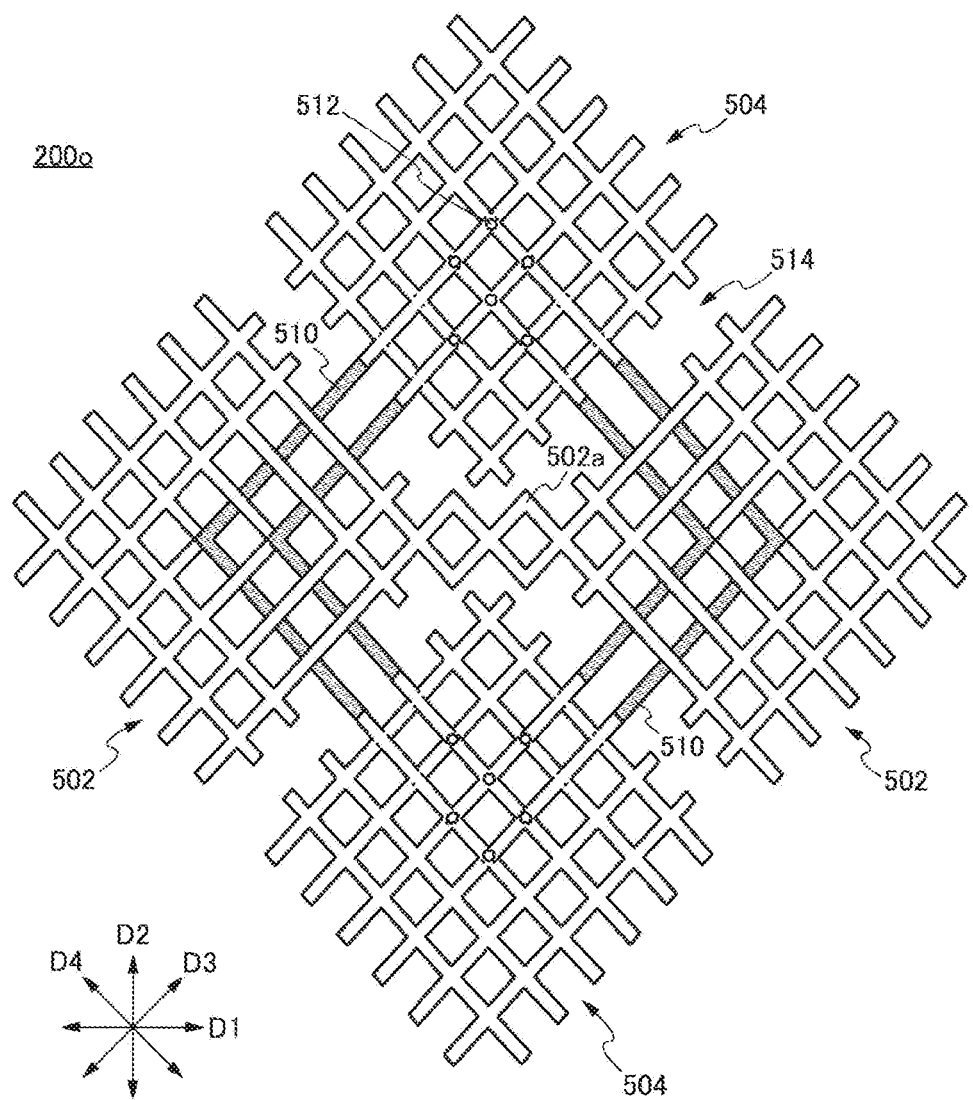
FIG. 37 is a plan view showing a structure of a touch sensor in a display device in modified example of embodiment 4.
Figure 38:
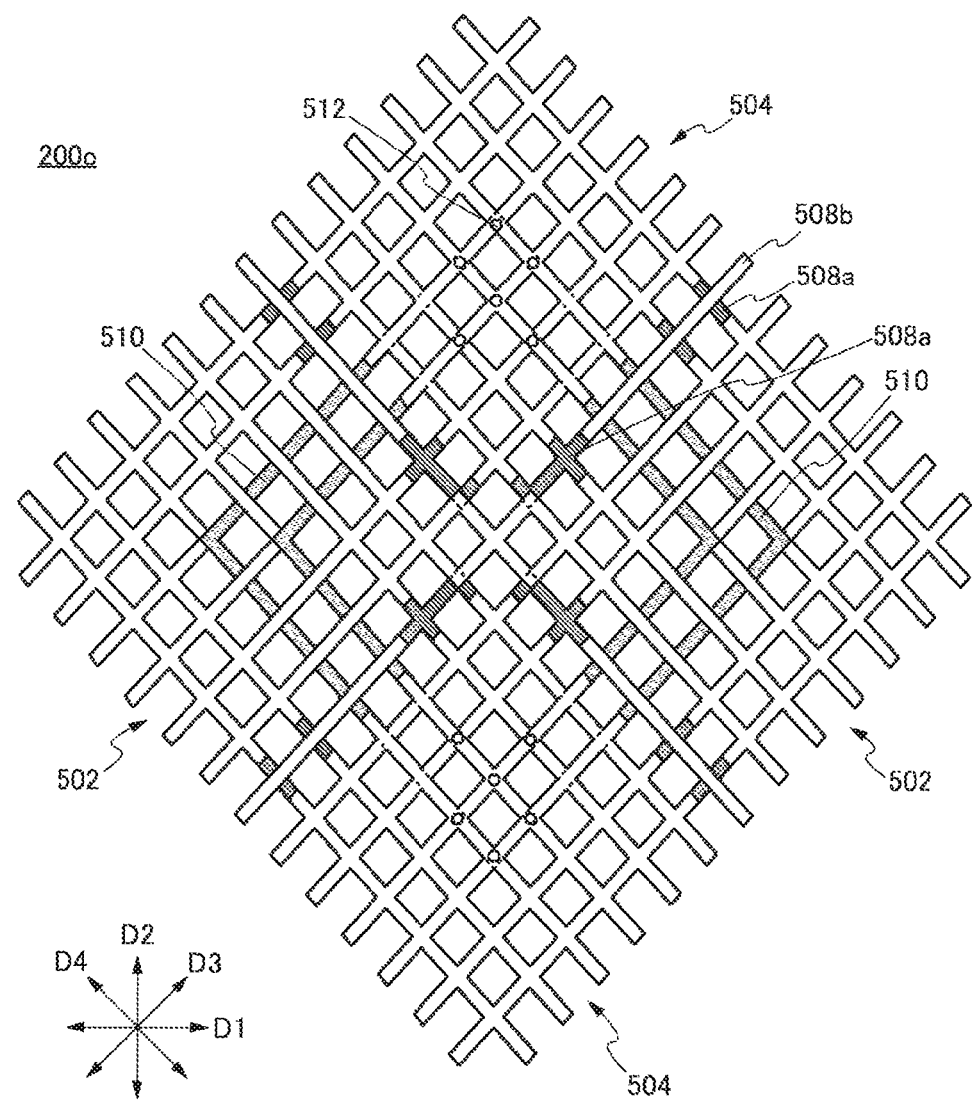
FIG. 38 is a plan view showing a structure of a touch sensor in a display device in modified example of embodiment 4.

FIG. 37 and FIG. 38 are examples of a touch sensor 200o in which the position of the contact hole 512 is increased in the structure shown in FIG. 35. Although FIG. 37 shows an example in which six contact holes 512 are arranged for one sensor electrode 504, the present invention is not limited to this structure and an arbitrary number can be arranged. FIG. 38 is an example in which the light shielding layer 508a and the light shielding layer 508b are arranged in the gap 514 shown in FIG. 34. As was explained using FIG. 16B, the light shielding layer 508b may be arranged only in a region which straddles the connection wiring 510, and the light shielding layer 508a may be arranged in other regions. In addition, in the case of the structure in FIG. 37 and FIG. 38, since the sensor electrode 504 is substantially connected by four connection wirings 510 and has a plurality of contact holes 512, there is high redundancy with respect to disconnection of the connection wiring 510.

Figure 39:
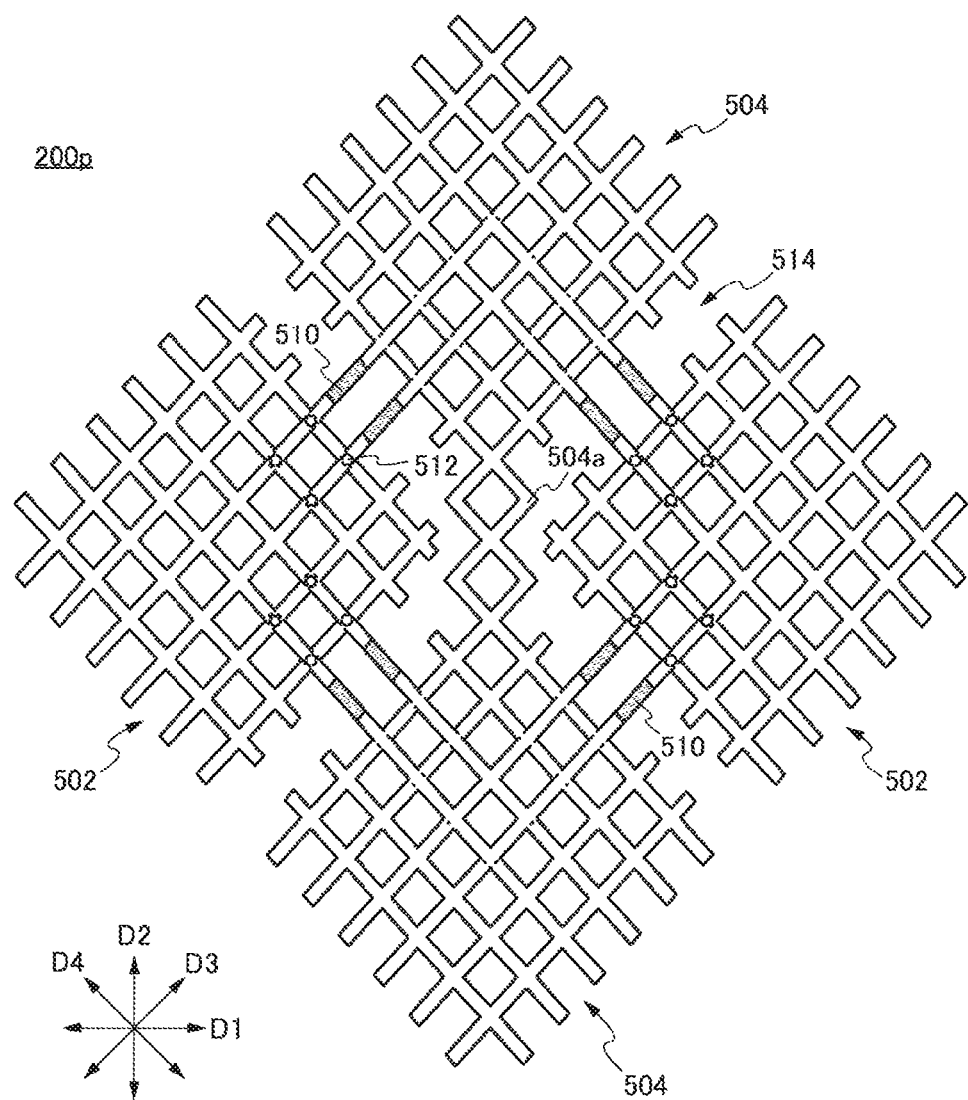
FIG. 39 is a plan view showing a structure of a touch sensor in a display device in modified example of embodiment 4.
Figure 40:
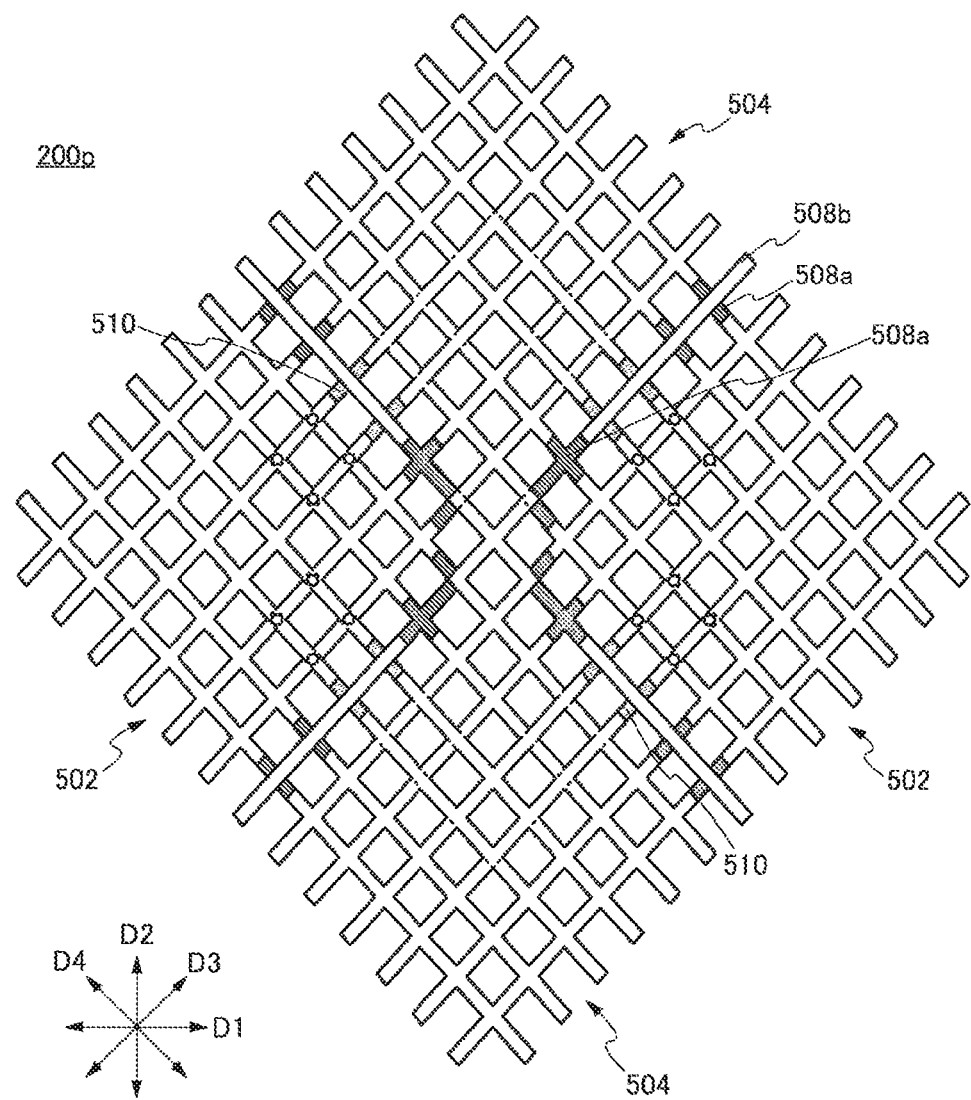
FIG. 40 is a plan view showing a structure of a touch sensor in a display device in modified example of embodiment 4.

FIG. 39 and FIG. 40 are examples of a touch sensor 200p in which adjacent sensor electrodes 504 are connected by a connecting part 504a instead of the structure in which adjacent sensor electrodes 502 are connected by a connecting part 502a in the structure shown in FIG. 33. In this case, the adjacent sensor electrodes 502 are connected by connection wirings 510 which are formed in different layers. Although FIG. 39 shows an example in which eight contact holes 512 are arranged for one sensor electrode 502, the present invention is not limited to this structure and an arbitrary number can be arranged. FIG. 40 is an example in which the light shielding layer 508a and the light shielding layer 508b are arranged in the gap 514 shown in FIG. 39. As was explained using FIG. 16B, the light shielding layer 508b may be arranged only in a region which straddles the connection wiring 510 and the light shielding layer 508a may be arranged in other regions. In addition, in the case of the structure in FIG. 39 and FIG. 40, since the sensor electrode 502 is substantially connected by four connection wirings 510 and has a plurality of contact holes 512, there is high redundancy with respect to disconnection of the connection wiring 510.

Figure 41:
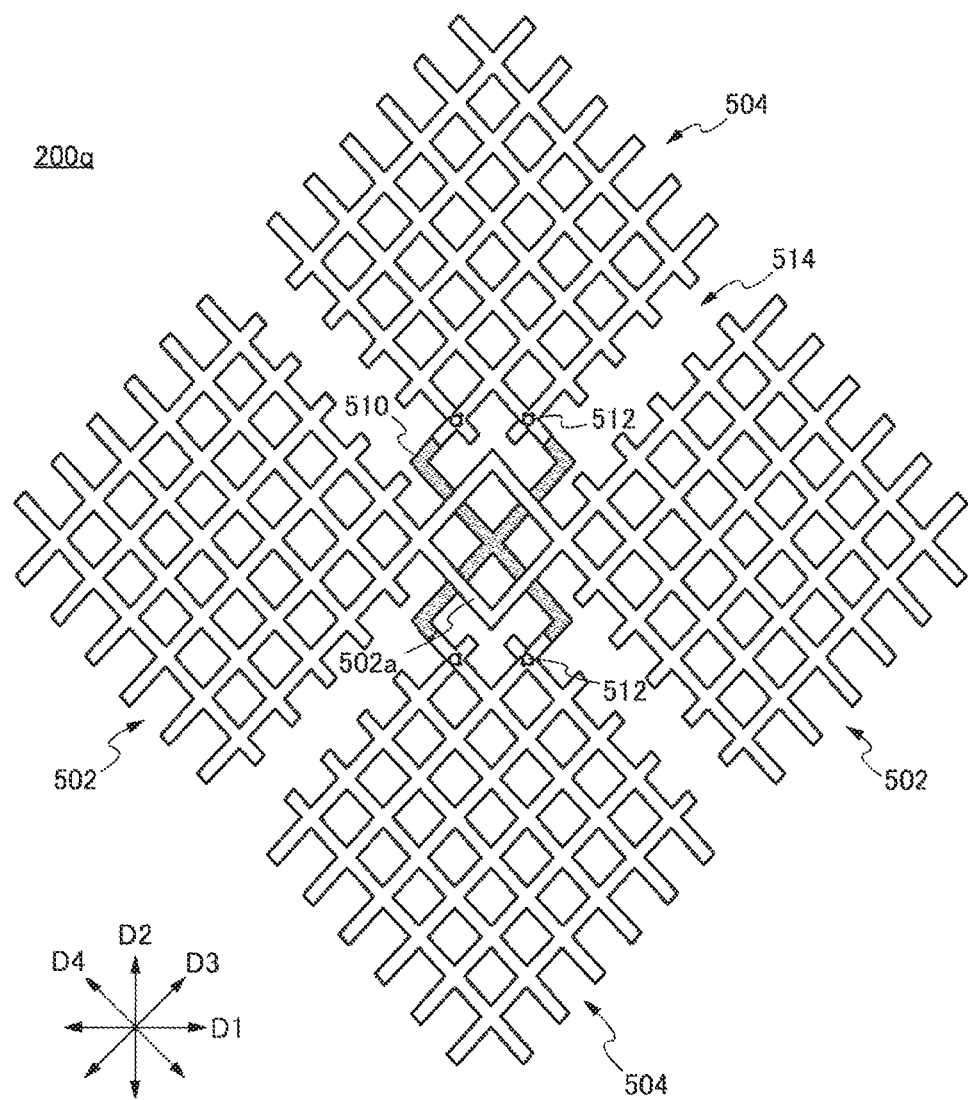
FIG. 41 is a plan view showing a structure of a touch sensor in a display device in modified example of embodiment 4.
Figure 42:
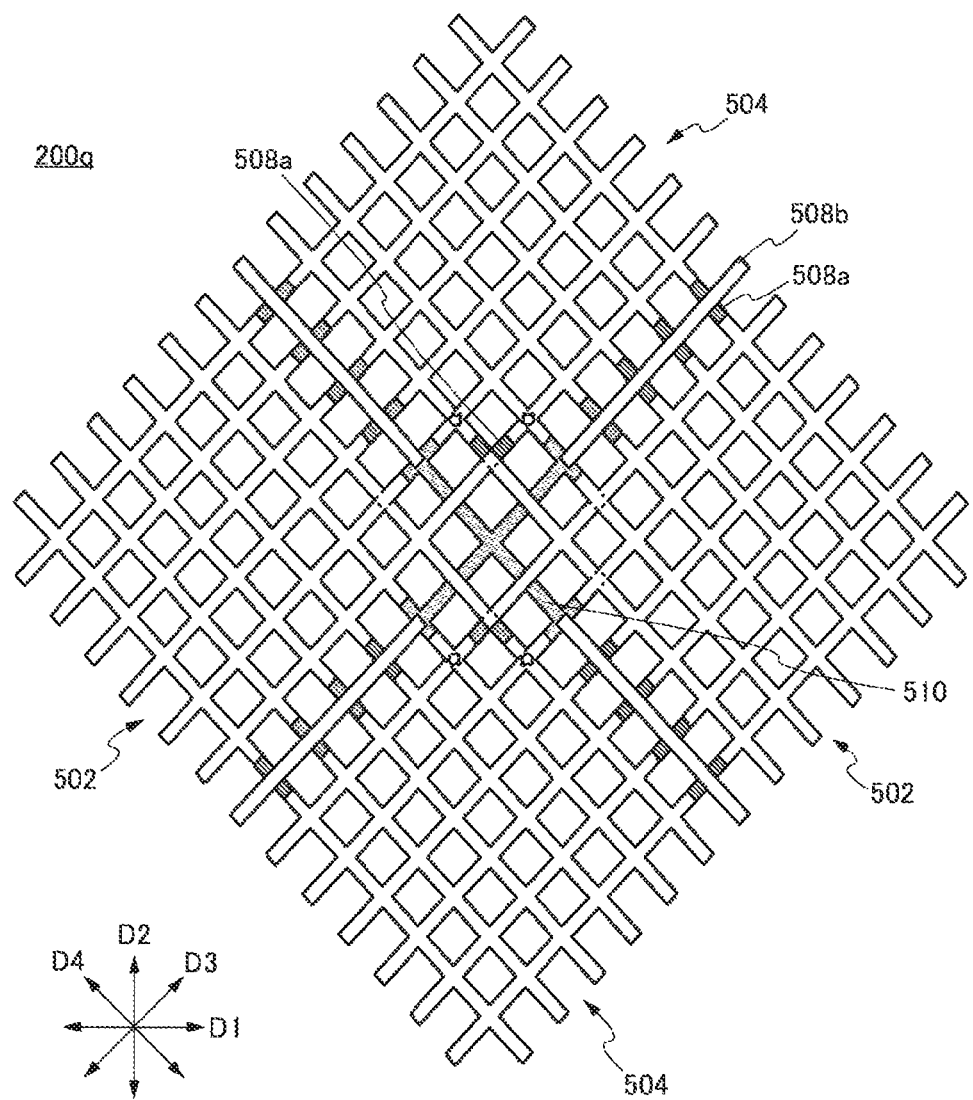
FIG. 42 is a plan view showing a structure of a touch sensor in a display device in modified example of embodiment 4.

FIG. 41 and FIG. 42 are examples in which the structure of the connecting part 502a for connecting adjacent sensor electrodes 502 and the structure of the connection wiring 510 are modified in the structure shown in FIG. 23. In the structure shown in FIG. 41, the connection wiring 510 has a shape in which two wirings intersect each other and connects adjacent sensor electrodes 504. FIG. 42 is an example in which the light shielding layer 508a and the light shielding layer 508b are arranged in the gap 514 shown in FIG. 41. As was explained using FIG. 16B, the light shielding layer 508b may be arranged only in a region which straddles the connection wiring 510, and the light shielding layer 508a may be arranged in other regions.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

In addition, although an organic EL display device was exemplified as an example of the display device in each of the embodiments described above, the present invention is not limited thereto and can also be applied to other display devices (for example, liquid crystal display devices or electrophoretic display devices). That is, as long as the touch sensor explained in each of the above embodiments can be mounted, it is possible to apply the present invention to any display device.

Furthermore, even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
a display region including a plurality of pixels;
a plurality of first electrodes formed by a first layer, and aligned in a first direction above the display region;
a plurality of second electrodes formed by the first layer, and aligned in a second direction intersecting the first direction;
a connection wiring formed by a second layer, and electrically connecting each of the plurality of first electrodes;
an insulating layer separating the first layer and the second layer; and
a light shielding layer formed by a same material as the connection wiring at a same time as a forming process of the connection wiring and located at a different position to the connection wiring, the light shielding layer overlapping a space between the plurality of first electrodes and the plurality of second electrodes in the first layer, in a plan view.

2. The display device according to claim 1, wherein end parts of the light shielding layer overlap end parts of the plurality of first electrodes and the plurality of second electrodes in the first layer.

3. The display device according to claim 1, wherein the second layer is located below the first layer.

4. The display device according to claim 1, wherein the light shielding layer is arranged in a matrix shape so as to overlap the plurality of first electrodes and the plurality of second electrodes and the space included in the first layer.

5. The display device according to claim 1, wherein the light shielding layer is formed by a resin material including a black pigment.

6. The display device according to claim 1, wherein the plurality of first electrodes and the connection wiring are electrically connected via an opening part arranged in the insulating layer.

7. The display device according to claim 1, wherein surfaces of the plurality of first electrodes and the plurality of second electrodes and a surface of the connection wiring are formed by the same metal material.

* * * * *